US011264524B1

(12) United States Patent
Derkacs

(10) Patent No.: US 11,264,524 B1
(45) Date of Patent: Mar. 1, 2022

(54) MULTIJUNCTION SOLAR CELLS

(71) Applicant: SolAero Technologies Corp., Albuquerque, NM (US)

(72) Inventor: Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 426 days.

(21) Appl. No.: 16/266,897

(22) Filed: Feb. 4, 2019

Related U.S. Application Data

(60) Provisional application No. 62/628,082, filed on Feb. 8, 2018.

(51) Int. Cl.
| | | |
|---|---|---|
| *H01L 31/0725* | (2012.01) | |
| *H01L 31/0232* | (2014.01) | |
| *H01L 31/078* | (2012.01) | |
| *H01L 31/0735* | (2012.01) | |
| *H01L 31/0304* | (2006.01) | |

(52) U.S. Cl.
CPC .... *H01L 31/0725* (2013.01); *H01L 31/02327* (2013.01); *H01L 31/03046* (2013.01); *H01L 31/078* (2013.01); *H01L 31/0735* (2013.01)

(58) Field of Classification Search
CPC ........... H01L 31/03046; H01L 31/0304; H01L 31/0264; H01L 31/0256; H01L 31/0248; H01L 31/02327; H01L 31/0725; H01L 31/0735; H01L 31/078
See application file for complete search history.

(56) References Cited

U.S. PATENT DOCUMENTS

| | | | | |
|---|---|---|---|---|
| 5,800,630 | A  * | 9/1998 | Vilela | H01L 31/184 |
| | | | | 136/249 |
| 6,316,715 | B1 * | 11/2001 | King | H01L 31/0687 |
| | | | | 136/255 |
| 2003/0070707 | A1 * | 4/2003 | King | H01L 31/0687 |
| | | | | 136/255 |
| 2003/0089392 | A1 | 5/2003 | Rohr et al. | |
| 2004/0065363 | A1 | 4/2004 | Fetzer et al. | |
| 2004/0079408 | A1 * | 4/2004 | Fetzer | H01L 31/184 |
| | | | | 136/262 |
| 2005/0247339 | A1 | 11/2005 | Barnham et al. | |

(Continued)

OTHER PUBLICATIONS

Campesato, R., Casale, M., Gori, G., Gabetta, G., Colletto, R., & Taylor, S. (Jun. 2009). High efficiency solar cells based on AlInGaP. In *Photovoltaic Specialists Conference (PVSC), 2009 34th IEEE* (6 pages). IEEE.

(Continued)

*Primary Examiner* — Golam Mowla

(57) ABSTRACT

A multijunction solar cell including an upper first solar subcell and having an emitter of p conductivity type with a first band gap, and a base of n conductivity type with a second band gap greater than the first band gap; a second solar subcell having an emitter of p conductivity type with a third band gap, and a base of n conductivity type with a fourth band gap greater than the third band gap; and an intermediate grading interlayer disposed between the first and second subcells and having a graded lattice constant that matches the first subcell on a first side and the second subcell on the second side, and having a fifth band gap that is greater than the second band gap of the first solar subcell.

22 Claims, 13 Drawing Sheets

(56) References Cited

U.S. PATENT DOCUMENTS

| | | | |
|---|---|---|---|
| 2006/0144435 A1 | 7/2006 | Wanlass | |
| 2007/0107772 A1* | 5/2007 | Meek | H01L 31/0687 136/255 |
| 2008/0190479 A1* | 8/2008 | Hsieh | H01L 31/0725 136/246 |
| 2008/0237633 A1 | 10/2008 | Jaeger et al. | |
| 2015/0104898 A1* | 4/2015 | Derkacs | H01L 31/1892 438/73 |
| 2016/0013348 A1* | 1/2016 | Cornfeld | H01L 31/078 136/255 |
| 2016/0329454 A1* | 11/2016 | Patel | H01L 31/078 |

OTHER PUBLICATIONS

Campesato, R., Gori, G., Greco, E., Scaccabarozzi, A., Binetti, S., Le Donne, A. (2013). High Efficiency AlInGaP and AlInGaAs Solar Cells for 32% Four Junction Devices. Conference paper presented at the 28th European Photovoltaic Solar Energy Conference and Exhibition (Sep. 30, 2013 to Oct. 4, 2013). Paris, France; 6 pages.

Geisz, J. F., Steiner, M. A., Garcia, I., Kurtz, S. R., & Friedman, D. J. (2013). Enhanced external radiative efficiency for 20.8% efficient single junction GaInP solar cells. *Applied Physics Letters*, 103(4), 041118; 5 pages.

Hess, R. R., Moore, C. D., & Goorsky, M. S. (1999). Lattice tilt and relaxation in InGaP/GaAs/Ge solar cells on miscut substrates. *Journal of Physics D: Applied Physics*, 32(10A); 5 pages.

King, R. R., Bhusari, D., Boca, A., Larrabee, D., Liu, X. Q., Hong, W., . . . & Karam, N. H. (2011). Band gap-voltage offset and energy production in next-generation multijunction solar cells. Progress in Photovoltaics: Research and Applications, 19(7), 797-812.

Speckman, D., Marvin, D., & Nocerino, J. (2005). Dendrite growth and degradation in multi-junction solar cells. Progress in Photovoltaics: Research and Applications, 13(2), 157-163.

\* cited by examiner

FIG. 6C

| | | | |
|---|---|---|---|
| Subcell E | n++ AlGaInAs | n contact layer | 273 |
| | n+ AlGaInAs | BSF | 272 |
| | n (Al)InGaAs | n base | 271 |
| | p+ InGaAs | p+ emitter | 270 |
| | p+ GaInP | window | 269 |
| | p+ AlGaInAs | barrier layer | 268 |
| | p AlGaInAs | metamorphic buffer layer | 267 |
| | p+ GaInP | barrier layer | 266 |
| | p++ AlGaInAs | p++ tunnel diode | 265b |
| | n++ AlGaInAs | n++ tunnel diode | 265a |
| Subcell D | n+ AlGaInAs | BSF | 264 |
| | n GaInAs | n base | 263 |
| | p+ InGaAs | p+ emitter | 262 |
| | p+ GaInP | window | 261 |
| | p+ GaInP | barrier layer | 260 |
| | p AlGaInAs | metamorphic buffer layer | 259 |
| | p+ GaInP | barrier layer | 258 |
| | p++ AlGaInAs | p++ tunnel diode | 257b |
| | n++ AlGaInAs | n++ tunnel diode | 257a |
| Subcell C | n+ AlInGaP | BSF | 256 |
| | n InGaP | n base | 255 |
| | p+ InGaAs | p+ emitter | 254 |
| | p+ GaInP | window | 253 |
| | p+ GaInP | barrier layer | 252 |
| | n AlGaInAs | metamorphic buffer layer | 251 |
| | p GaInP | barrier layer | 250 |
| | p++ | p++ tunnel diode | 214b |
| | n++ | n++ tunnel diode | 214a |
| Subcell B | n+ AlGaAs | BSF | 213 |
| | n InGaP | n base | 212 |
| | p+ AlGaAs | p+ emitter | 211 |
| | p+ | window | 210 |
| | p++ | p++ tunnel diode | 209b |
| | n++ AlGaAs | n++ tunnel diode | 209a |
| Subcell A | n+ AlInP | BSF | 208 |
| | n AlGaInP | base | 207 |
| | p AlGaInP | emitter | 206b |
| | p+ AlGaInP | p+ emitter | 206a |
| | p+ AlInP | window | 205 |
| | p++ GaAs | contact layer | 204 |
| | GaInP | etch stop layer | 203 |
| | GaAs | buffer layer | 202 |
| | GaAs | Substrate | 201 |

| | | |
|---|---|---|
| n++ AlGaInAs | n contact layer | 539 |
| n+ AlGaInAs | BSF | 538 |
| n (Al)InGaAs | n base | 537 |
| p+ GaInAs | p+ emitter | 536 |
| p+ AlGaInAs | window | 535 |
| p AlGaInAs | metamorphic buffer layer | 534 |
| p GaInP | barrier layer | 533 |
| p++ AlGaInAs | p+ tunnel diode | 532b |
| n++ AlGaInAs | n+ tunnel diode | 532a |
| n+ AlGaInAs | BSF | 531 |
| n (Al)InGaAs | n base | 530 |
| p+ GaInAs | p+ emitter | 529 |
| p+ GaInP | window | 528 |
| p++ AlGaInAs | p+ tunnel diode | 527b |
| n++ AlGaInAs | n+ tunnel diode | 527a |
| n+ AlGaInAs | BSF | 526 |
| n+ (Al)InGaAs | n base | 525 |
| p+ InGaAs | p+ emitter | 524 |
| p+ GaInP | window | 523 |
| p+ GaInP | barrier layer | 522 |
| n AlGaInAs | metamorphic buffer layer | 521 |
| p GaInP | barrier layer | 520 |
| p++ | p++ tunnel diode | 519b |
| n++ | n++ tunnel diode | 519a |
| n+ AlInGaP | BSF | 518 |
| n InGaP | n base | 517 |
| p+ GaAs | p+ emitter | 516 |
| p+ GaInP | window | 515 |
| p++ | p++ tunnel diode | 514b |
| p++ | n++ tunnel diode | 514a |
| n+ AlInGaP | BSF | 513 |
| n InGaP | n base | 512 |
| p+ AlGaAs | p+ emitter | 511 |
| p+ AlInP | window | 510 |
| p++ | p++ tunnel diode | 509b |
| n ++ | n++ tunnel diode | 509a |
| n+ AlInP | BSF | 508 |
| n AlGaInP | base | 507 |
| p AlGaInP | emitter | 506b |
| p+ AlGaInP | p+ emitter | 506a |
| p+ AlInP | window | 505 |
| p++ GaAs | contact layer | 504 |
| GaInP | etch stop layer | 503 |
| GaAs | buffer layer | 502 |
| GaAs | Substrate | 501 |

Subcell F: 539–535
Subcell E: 531–528
Subcell D: 526–523
Subcell C: 518–515
Subcell B: 513–510
Subcell A: 508–505

FIG. 7A

MULTIJUNCTION SOLAR CELLS

REFERENCE TO RELATED APPLICATIONS

This application claims the benefit of U.S. Provisional Patent Application Ser. No. 62/628,082 filed Feb. 8, 2018.

This application is related to co-pending U.S. patent application Ser. No. 14/828,206, filed Aug. 17, 2015 and U.S. patent application Ser. No. 15/203,975, filed Jul. 7, 2016.

All of the above related applications are incorporated herein by reference in their entirety.

BACKGROUND OF THE INVENTION

Field of the Invention

The present invention relates to the field of semiconductor devices, and to fabrication processes and devices such as multijunction solar cell based on III-V semiconductor compounds.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio (measured in watts per kilogram), the power-to-area ratio (measured in watts per square meter) of the solar cell array or panel, and lifetime efficiency of the solar cells become increasingly more important, and there is increasing interest not only the amount of power provided at initial deployment, but over the entire service life of the satellite system, or in terms of one design specification, the amount of power provided at the "end of life" (EOL).

The radiation hardness of a solar cell is defined as how well the cell performance after exposure to electron or proton particle radiation which is a characteristic of the space environment. A standard metric is the ratio of the end of life performance (or efficiency) divided by the beginning of life performance (EOL/BOL). The EOL performance is a cell performance parameter after exposure to a given fluence of electrons or protons (which may be different for different space missions or orbits). The BOL performance is the performance parameter prior to exposure to the particle radiation.

Radiation hardness is primarily dependent on a solar cell's minority carrier diffusion length ($L_{min}$) in the base region of the cell. The less degraded $L_{min}$ is after exposure to particle radiation, the less the solar cell performance will be reduced. A number of strategies have been used to either improve $L_{min}$, or make the solar cell less sensitive to $L_{min}$ reductions. Improving $L_{min}$ has largely involved including a dopant grade in the base of the cell that creates an electric field to direct minority carriers to the junction of the device, thereby effectively increasing $L_{min}$. The effectively longer $L_{min}$ will improve the cell performance, even after the particle radiation exposure. Making the cell less sensitive to $L_{min}$ reductions has involved increasing the optical absorption of the base layer such that thinner layers of the base can be used to absorb the same amount of incoming optical radiation.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, photons pass through the successive subcells with each subcell being designed for photoelectric conversion in a specific wavelength band. After passing through a subcell, the photons that are not absorbed and converted to electrical energy propagate to the next subcells, where such photons are intended to be captured and converted to electrical energy.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. Electrical properties such as the short circuit current density ($J_{sc}$), the open circuit voltage ($V_{oc}$), and the fill factor (FF), which determine the efficiency and power output of the solar cell, are affected by the slightest change in such design variables. However, in reality, changing a material parameter that increases the voltage may result in a decrease in current, and therefore a lower power output. Moreover, the output power is also not a single product of just $V_{oc}$ and $J_{sc}$, but the power is computed as a Fill Factor (FF) times the product of $V_{oc}$ and $J_{sc}$. As might be anticipated, the Fill Factor parameter is not a constant, but in fact may vary between 0.5 and somewhat over 0.8 for different arrangements of compositions, with the predictability or estimate of the realized FF value not always being fully theoretically understood or computable. Stated another way, an attempt to maximize power by varying a composition to increase the $V_{oc}$ or $J_{sc}$, or both, may not result in higher power, since although the product $V_{oc}$ and $J_{sc}$ may increase, the FF may decrease and the resulting power also decrease.

It must be further emphasized that the "fine tuning" of the composition, band gaps, thickness, and doping of every layer in the arrangement has critical effect on electrical properties such as the open circuit voltage ($V_{oc}$).

To illustrate the practical effect, consider a design change that results in a small change in the $V_{oc}$ of an active layer in the amount of 0.01 volts, for example changing the $V_{oc}$ from 2.72 to 2.73 volts. Assuming all else is equal and does not change, such a relatively small incremental increase in voltage would typically result in an increase of solar cell efficiency from 29.73% to 29.84% for a triple junction solar cell.

For a single junction GaAs subcell in a triple junction device, going from 1.00 to 1.01 volts (everything else being the same) would increase the efficiency of that junction from 10.29% to 10.39%, about a 1% relative increase. If it were a single junction stand-alone solar cell, the efficiency would go from 20.58% to 20.78%, still about a 1% relative improvement in efficiency.

Present day commercial production processes are able to define and establish band gap values of epitaxially deposited layers as precisely as 0.01 eV, so such "fine tuning" of compositions and consequential open circuit voltage results are well within the range of operational production specifications for commercial products.

As described above, it is evident that the material design parameters are interdependent and interact in complex and often unpredictable ways, and for that reason are not "result effective" variables that those skilled in the art confronted with complex design specifications and practical operational considerations can easily adjust to optimize performance. As noted above, to further complicate the calculus, such design variables $V_{oc}$, $J_{sc}$, FF and resulting properties also vary in a non-uniform manner over time (i.e. during the operational life of the system).

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters.

Accordingly, the present disclosure provides a new design approach to multijunction solar cells which emphasizes radiation hardness of such devices by providing an arrangement that allows thinner base layers, improved methods of manufacturing and assembling photovoltaic solar arrays that can result in decreases in cost, less weight, greater compactness, and increased efficiency and performance.

SUMMARY OF THE DISCLOSURE

Objects of the Disclosure

It is an object of the present disclosure to increase the efficiency of a multijunction solar cell wafer.

It is another object of the present disclosure to provide in a multijunction solar cell in which the emitter is of p type and the base is of n type.

It is another object of the present disclosure to provide in a multijunction solar cell in which the base of the upper solar subcell has a band gap greater than the emitter of the upper solar subcell.

It is another object of the present disclosure to provide in a multijunction solar cell in which the emitter of the upper solar subcell is doped from $1 \times 10^{17}$ to $5 \times 10^{17}$ free carriers per cubic centimeter.

It is another object of the present invention to provide an upright p on n solar cell with metamorphic layer.

It is another object of the present invention to provide a p on n four junction solar cell in which the lower two subcells are lattice mismatched.

Some implementations of the present disclosure may incorporate or implement fewer of the aspects and features noted in the foregoing objects.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

Features of the Invention

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 2.0, or 1.3 to 1.4, or 1.5 to 1.9 eV.

Briefly, and in general terms, the present disclosure provides a multijunction solar cell comprising: an upper first solar subcell and having an emitter of n conductivity type with a first band gap, and a base of p conductivity type with a second band gap greater than the first band gap; a second solar subcell adjacent to the upper first solar subcell having an emitter of n conductivity type with a third band gap, and a base of p conductivity type; wherein the emitter of the upper first solar cell is doped in the range of $1 \times 10^{17}$ free carriers per cubic centimeter to $5 \times 10^{17}$ free carriers per cubic centimeter.

In some embodiments, the base of the upper first solar subcell is doped in the range of $1 \times 10^{18}$ to $5 \times 10^{18}$ free carriers per cubic centimeter.

In some embodiments, the solar cell is a three junction solar cell, and the emitter of the upper first solar subcell is composed of GaInP or AlGaAs and the band gap of the emitter of the upper first solar subcell is equal to or greater than 1.91 eV, and the band gap of the base of the upper first solar subcell is in the range of 1.911 to 2.1 eV and greater than the band gap of the emitter;

In some embodiments, the emitter of the middle subcell is composed of (In)GaAs and the base of the middle solar subcell is composed of InGaP or AlGaAs, and the band gap of the emitter of the upper middle subcell is 1.41 eV, and the band gap of the base of the middle solar subcell is in the range of 1.411 to 1.91 eV and greater than the band gap of the emitter; and In some embodiments, the emitter of the bottom solar subcell is composed of InGaAs; the base of the bottom solar subcell is composed of InGaP or AlInGaAs and the band gap of the emitter of the bottom subcell is 1.0 eV, and the band gap of the base of the bottom solar subcell is in the range of 1.01 to 1.6 eV.

In some embodiments, the solar cell is a four junction solar cell wherein the base of the upper first solar subcell is composed of GaInP or AlGaAs and the emitter of the upper first solar subcell is composed of AlInGaP or AlGaAs and the band gap of the emitter of the upper first solar subcell is in the range of 1.91 to 2.0 eV, and the band gap of the base of the upper first solar subcell is greater than that of the emitter by an amount in the range of 1.01 eV to 1.0 eV.

In some embodiments, the solar cell is a five junction solar cell, and the base of the upper first solar subcell is composed of GainP or AlGaAs; the emitter of the upper first solar subcell is composed of AlInGaP or AlGaAs; and the band gap of the emitter of the upper first solar subcell is 2.1 eV or greater, and the band gap of the base of the upper first solar subcell is greater than that of the emitter by an amount in the range of 0.01 to 0.1 eV.

In some embodiments, the solar cell is a six junction solar cell, and the base of the upper first solar subcell is composed of GaInP or AlGaAs and the emitter of the upper first solar subcell is composed of AlInGaP or AlGaAs and the band gap of the emitter of the upper first subcell is equal to or greater than 2.1 eV, and the band gap of the base of the upper first subcell is greater than that of the emitter by an amount in the range of 0.01 to 0.1 eV.

In some embodiments of a triple junction solar cell, the subcells have band gaps in the range of 1.80 to 2.1 eV, 1.2 to 1.8 eV, and 0.7 to 1.2 eV respectively.

In some embodiments of a four junction solar cell, the subcells have band gaps in the range of 1.90 to 2.2 eV, 1.42 to 1.50 eV, and 1.05 to 1.15 eV, and 0.6 to 0.7 eV respectively.

In some embodiments of a five junction solar cell, the subcells have band gaps in the range of 1.92 to 2.2 eV, 1.65 to 1.78 eV, 1.42 to 1.50 eV, 1.05 to 1.15 eV, and 0.6 to 0.9 eV respectively.

In some embodiments of a six junction solar cell, the subcells have band gaps in the range of 1.92 to 2.2 eV, 1.65 to 1.78 eV, 1.42 to 1.50 eV, 1.05 to 1.15 eV, 0.7 to 0.85 eV, and 0.6 to 0.7 eV respectively.

In some embodiments, the emitter of the upper first solar subcell has a gradation in doping from the top of the emitter adjacent to the window layer in which the doping is approximately $1 \times 10^{18}$ free carriers per cubic centimeter to the bottom of the emitter directly disposed over the base region in which the doping is in the range of $5 \times 10^{15}$ free carriers per cubic centimeter to $1 \times 10^{16}$ free carriers per cubic centimeter.

In some embodiments, the emitter of the upper first solar subcell has a thickness at least three times thicker than the base of the upper first solar subcell.

In some embodiments, there further comprises a tunnel diode directly adjacent to the base layer of the upper first solar subcell, and wherein the emitter layer of the first middle subcell is directly adjacent to the tunnel diode layer so that there is no back surface field (BSF) layer between the upper first solar subcell and the first middle subcell.

In some embodiments, the emitter section of the upper first solar subcell has a first region in which the doping is graded, and a second region directly disposed over the first region in which the doping is constant.

In some embodiments, wherein the first graded interlayer is composed of any of the As, N, Sb based III-V compound semiconductors subject to the constraints of having the in-plane lattice parameter greater or equal to that of the second subcell and less than or equal to that of the third subcell, and having a band gap energy greater than that of the third subcell, and is compositionally graded to lattice match the second subcell on one side and the third subcell on the other side, and the second graded interlayer is composed of any of the As, N, Sb based III-V compound semiconductors subject to the constraints of having the in-plane lattice parameter greater or equal to that of the third subcell and less than or equal to that of the bottom fourth subcell, and having a band gap energy greater than that of the third subcell, and is compositionally graded to lattice match the third subcell on one side and the bottom fourth subcell on the other side.

In some embodiments, the first and second graded interlayers are composed of $(In_xGa_{1-x})_yAl_{1-y}As$ with $0<x<1$, $0<y<1$, and x and y selected such that the band gap of each interlayer remains constant throughout its thickness.

In some embodiments, the band gap of the first graded interlayer remains constant at 1.5 eV throughout the thickness of the first graded interlayer, and the band gap of the second graded interlayer remains constant at 1.1 eV throughout the thickness of the second graded interlayer.

In some embodiments, the upper subcell is composed of an InGaP emitter layer and an InGaP base layer, the second subcell is composed of GaInP emitter layer and a GaAs base layer.

In some embodiments of a four, five or six junction solar cell, the third subcell is composed of a InGaAs emitter layer and a InGaAs base layer, the fourth subcell is composed of a InGaAs emitter layer and a InGaAs base layer.

In another aspect, the present disclosure provides a multijunction solar cell comprising: an upper first solar subcell having a first band gap, the upper first solar subcell including an InGaP emitter layer having a first band gap and an InGaP base layer having a second band gap greater than that of the emitter layer; a second solar subcell below the first solar subcell and having an emitter layer composed of InGaP and having a third band gap, the base layer of the second solar subcell is composed of GaAs with a fourth band gap being greater than that of the third band gap; a first graded interlayer, composed of InGaAlAs, disposed below and adjacent to the second solar subcell, wherein the first graded interlayer has a fifth band gap greater than the fourth band gap, and wherein the band gap of the first graded interlayer remains constant at about 1.5 eV throughout its thickness; a third solar subcell below the first graded interlayer, such that the third subcell is lattice mismatched with respect to the second subcell, wherein the emitter layer of the third solar subcell is composed of InGaP with a sixth band gap, and the base layer of the third solar subcell is composed of InGaAs with a seventh band gap greater than that of the sixth band gap; a second graded interlayer, composed of InGaAlAs, disposed below and adjacent to the third solar subcell, wherein the second graded interlayer has an eighth band gap greater than the seventh band gap, and wherein the band gap of the second graded interlayer remains constant at about 1.1 eV throughout its thickness; and a lower fourth solar subcell below the second graded interlayer, wherein the fourth solar subcell is lattice mismatched with respect to the third solar subcell, wherein an emitter layer has a ninth band gap, and a base layer composed of InGaAs with a tenth band gap greater than that of the ninth band gap.

In another aspect, the present disclosure provides a method of manufacturing a solar cell comprising: providing a first substrate; forming a contact layer over the first substrate; forming a window layer over the contact layer; forming an upper first solar subcell having a first band gap over the top surface of the window layer having an emitter of p conductivity type and a base of n conductivity type; forming a second solar subcell adjacent to said first solar subcell and having a second band gap smaller than said first band gap, and having an emitter of p conductivity type and a base of n conductivity type; forming a first graded interlayer adjacent to said second solar subcell; said first graded interlayer having a third band gap greater than said second band gap; forming a third solar subcell adjacent to said second solar subcell and having a fourth band gap smaller than said second band gap, and having an emitter of p conductivity type and a base of n conductivity type; forming a second graded interlayer adjacent to said third solar subcell; said second graded interlayer having a fifth band gap greater than said fourth band gap; forming a fourth solar subcell adjacent so said second graded interlayer, said fourth subcell having a sixth band gap smaller than said fourth band gap such that said fourth subcell is lattice mismatched with respect to said third subcell, and having an emitter of p conductivity type and a base of n conductivity type; mounting a surrogate substrate on top of the fourth solar subcell; and removing the first substrate.

BRIEF DESCRIPTION OF THE DRAWINGS

The invention will be better and more fully appreciated by reference to the following detailed description when considered in conjunction with the accompanying drawings, wherein:

FIG. 6C is a cross-sectional view of the solar cell of a third embodiment of a five junction solar cell according to the present disclosure after an initial stage of fabrication including the deposition of certain semiconductor layers on the growth substrate;

FIG. 7A is a cross-sectional view of the solar cell of one embodiment of a six junction solar cell according to the present disclosure after an initial stage of fabrication including the deposition of certain semiconductor layers on the growth substrate.

GLOSSARY OF TERMS

Figure 1A:
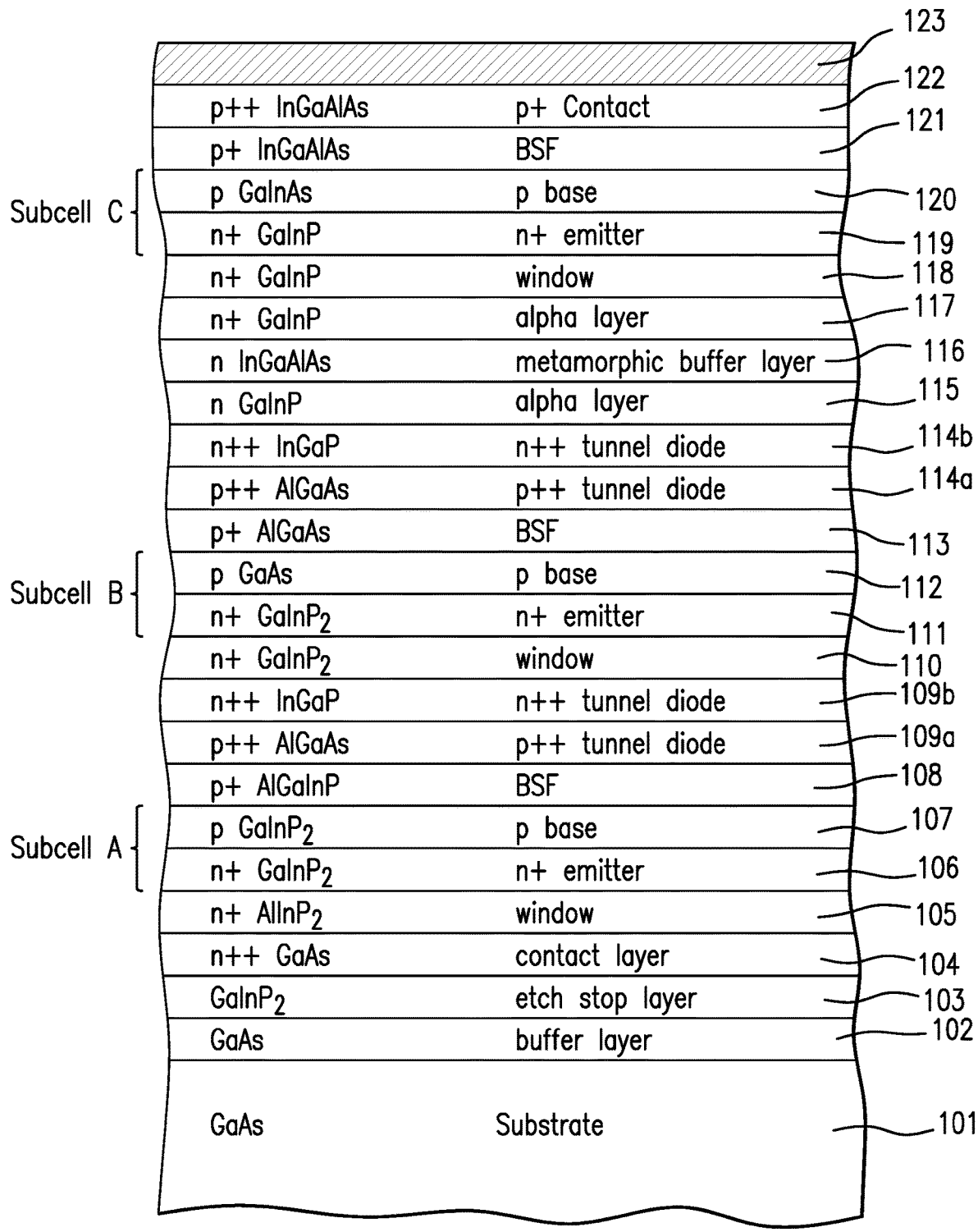
FIG. 1A is a cross-sectional view of a three junction solar cell after several stages of fabrication including the deposition of certain semiconductor layers on the growth substrate.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material.

The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.9 to 2.3 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.3 to 1.9 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (e.g., a band gap in the range of 0.8 to 1.2 eV). A surrogate substrate or support structure is then attached or provided over the "bottom" or substantially lattice-mismatched lower subcell, and the growth semiconductor substrate is subsequently removed. (The growth substrate may then subsequently be re-used for the growth of a second and subsequent solar cells).

A variety of different features of inverted metamorphic multijunction solar cells disclosed in the related applications of Applicant may be included in the structures and processes associated with the solar cells of the present disclosure. However, more particularly, the present disclosure is directed to the fabrication of a multijunction inverted metamorphic solar cell with at least one p on n subcell, all grown on a single growth substrate.

The present disclosure is directed to different embodiments of an inverted metamorphic solar cell with three, four, five or six subcells. Such embodiments may include one, two or three metamorphic or grading interlayers.

In the present disclosure, in one embodiment, in the construction with three subcells, the band gaps of each subcell will be in the range of 1.80 to 2.1 eV (e.g., 1.91 eV), 1.2 to 1.8 eV (e.g., 1.42 eV), and 0.7 to 1.2 eV (e.g., 0.68 eV) respectively.

In the construction that includes four subcells, the band gaps of each subcell will be in the range of 1.90 to 2.2 eV (e.g., 1.91 eV), 1.42 to 1.50 eV (e.g., 1.42 eV), and 1.05 to 1.15 eV (e.g., 1.10 eV), and 0.6 to 0.7 eV (e.g., 0.68 eV) respectively.

In a construction that includes five subcells, the band gaps of each subcell will be in the range of 1.92 to 2.2 eV (e.g., 2.10 eV), 1.65 to 1.78 eV (e.g., 1.73 eV), 1.42 to 1.50 eV (e.g., 1.42 eV), 1.05 to 1.15 eV (e.g., 1.10 eV), and 0.6 to 0.9 eV respectively.

In a construction that includes six subcells, the band gaps of each subcell will be in the range of 1.92 to 2.2 eV (e.g., 2.10 eV), 1.65 to 1.78 eV (e.g., 1.73 eV), 1.42 to 1.50 eV (e.g., 1.42 eV) 1.05 to 1.15 eV (e.g., 1.10 eV), 0.7 to 0.85 eV, and 0.6 to 0.7 eV respectively.

In the present disclosure, in one embodiment, in one or more subcells the band gap of the base layer is greater than that of the emitter layer above it. In some embodiments, the amount of the band gap that the base layer is greater than that of the emitter is in the range of 0.01 to 1.00 eV. In some embodiments, in one or more subcells of the solar cell, the amount of the band gap that the base layer is greater than that of the emitter in the range of 0.01 to 0.10 eV.

Prior to discussing the specific embodiments of the present disclosure, a brief discussion of some of the issues associated with the design of multijunction solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and direction and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a single "result effective variable" that one skilled in the art can simply specify and incrementally adjust to a particular level and thereby increase the power output and efficiency of a solar cell.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

The efficiency of a solar cell is not a simple linear algebraic equation as a function of the amount of gallium or aluminum or other element in a particular layer. The growth of each of the epitaxial layers of a solar cell in a reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type, and are within the scope of the present disclosure.

The present disclosure is in one embodiment directed to a growth process using a metal organic chemical vapor deposition (MOCVD) process in a standard, commercially available reactor suitable for high volume production. Other embodiments may use other growth technique, such as MBE. More particularly, regardless of the growth technique, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

Some comments about MOCVD processes used in one embodiment are in order here.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The concept of a rear junction solar cell for use in a multijunction solar cell has recently been reported on by NREL in the article "Enhanced External Radiative Efficiency for 20.8% Efficient Single-junction GaInP Solar Cells", J. F. Geisz, M. A. Steiner, I. Garcia, S. R. Kurtz, and D. J. Friedman: Applied Physics Letters 103, 041118 (2013), hereinafter referred to as the Geisz et al reference or the "NREL solar cells". In this device, an n-on-p solar cell consists of a thick (1 um) n-type InGaP emitter layer which has been doped to the level of $5.0 \times 10^{17}$ free carriers per cubic centimeter (abbreviated as 5E17 e/cm$^2$) and a high band gap p-type AlInGaP base doped $1.0 \times 10^{17}$ free carriers per cubic centimeter (i.e., 1E17 e/cm$^2$). As the dark current of the solar cell is determined by the doping level in the lower band gap material, the total dark current of their device is lower due to the shorter depletion region in the lower band gap material resulting from the higher emitter doping, and the near elimination of dark current contribution from the higher band gap AlInGaP base.

One electrical parameter of consideration in evaluating the performance of a solar cell is the difference between the band gap and the open circuit voltage, or $(E_g/q-V_{oc})$, of a particular layer where q is the elementary charge. The normalized difference between $E_g$ and $V_{oc}$ has been accepted as an empirical figure of merit to compare the quality of solar cells of different materials [R. R. King, D. Bhusari, A. Boca, D. Larrabee, X. Q. Liu, W. Hong, C. M. Fetzer, D. C. Law, and N. H. Karam, Prog. Photovolt.: Res. Appl. 19, 797 (2011)].

A solar cell's voltage is generally considered high when $W_{oc} \equiv (E_g/q-V_0) < 0.4$ V. The external radiative emission efficiency ($N_{ext}$) of a solar cell at open-circuit is a much better figure of merit because it characterizes how closely the $V_{oc}$ has approached the Shockley-isser (SQ) detailed balance or radiative limit.

The NREL solar cell is a single junction 1.81 eV GaInP n-on-p structures with a 1 micron thick n-type emitter layer doped 5E17, and a p-type base layer less than 40 nm in thickness. The Geisz et al reference reports results of 20.8% solar conversion efficiency and 8% external radiative efficiency at one sun AM 1.5 global conditions for these NREL solar cells.

The NREL arrangement provides a dramatic improvement in the open circuit voltage of the InGaP cell so that the value of the parameter $E_g/q-V_{oc}$ is about 0.35, which is considerably lower than most "good" solar cells which have a $E_g/q-V_{oc}$ value equal to 0.4.

The rear junction solar cell has proven its ability to increase the voltage in InGaP cells as reported by NREL. However, NREL solar cell currently only works when the device is grown inverted, indicating the extreme sensitivity to the n-type emitter quality that can vary depending upon whether the device is grown inverted or upright.

The present disclosure goes beyond the NREL disclosure and proposes the use of a p-on-n solar cell rather than an n on p solar cell to achieve further improvements.

In the p-on-n device described in the present disclosure, the thicker emitter region is now p-type which means that the minority carriers that diffuse to the p-n junction are now electrons instead of holes. It is well known that the minority carrier diffusion length of elections is much longer than that of holes—often by an order of magnitude. Thus, a p-on-n device will be much less sensitive to a charged particle radiation environment and the design also enables a more easily manufacturable rear junction multijunction solar cell.

The use of a p-on-n cell can also result in a higher $V_{oc}$ due to the photo Dember effect, in which a charged dipole is formed adjacent to the surface of a semiconductor body following the photogeneration of charge carriers in the semiconductor body upon illumination.

The use of a p-on-n rear junction solar cell is not limited to implementation only in the top InGaP cell, but rather in several or every cell in a multijunction solar cell. Although the embodiments depicted and described in this disclosure will depict every subcell in the solar cell being a p-on-n subcell, in some embodiments one or more of the subcells may be p-on-n subcells, with the remaining subcells being n-on-p subcells.

FIG. 1A is a cross-sectional view of a typical n on p three junction solar cell after several stages of fabrication including the deposition of certain semiconductor layers on the growth substrate for the purpose of comparison.

In particular, FIG. 1A depicts the sequential formation of the three subcells A, B and C on a GaAs growth substrate. FIG. 1A depicts a substrate 101, which is preferably gallium arsenide (GaAs), but may also be germanium (Ge) or other suitable material. For GaAs, the substrate is preferably a 15 degrees off-cut substrate, that is to say, its surface is orientated 15 degrees off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably GaInAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of GaInP and the base layer 107 is composed of AlGaInP. In some embodiments, more generally, the base-emitter junction may be a heterojunction. In other embodiments, the base layer may be composed of (Al)GaInP, where the aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 20.

In some embodiments, the band gap of the base layer 107 is 1.91 eV or greater.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, the BSF layer 18 reduces recombination loss at the backside of the solar subcell A and thereby reduces the recombination in the base.

On top of the BSF layer 108 a sequence of heavily doped p-type and n-type layers 109a and 109b is deposited that forms a tunnel diode, i.e. an ohmic circuit element that forms an electrical connection between subcell A to subcell B. Layer 109a is preferably composed of p++ AlGaAs, and layer 109b is preferably composed of n++ GaInP.

On top of the tunnel diode layers 109 a window layer 110 is deposited, preferably n+ GaInP. The advantage of utilizing GaInP as the material constituent of the window layer 110 is that it has an index of refraction that closely matches the adjacent emitter layer 111, as more fully described in U.S. patent application Ser. No. 12/258,190, filed Oct. 24, 2008. The window layer 110 used in the subcell B also operates to reduce the interface recombination loss. It should be apparent to one skilled in the art, that additional layer(s) may be added or deleted in the cell structure without departing from the scope of the present disclosure.

On top of the window layer 110 the layers of subcell B are deposited: the n-type emitter layer 111 and the p-type base layer 112. These layers are preferably composed of GaInP and GaIn0.0015As respectively (for a Ge substrate or growth template), or GaInP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present disclosure will be discussed in conjunction with FIG. 20B.

In some previously disclosed implementations of an inverted metamorphic solar cell, the middle cell was a homostructure. In some embodiments of the present disclosure, similarly to the structure disclosed in U.S. patent application Ser. No. 12/023,772, the middle subcell becomes a heterostructure with an GaInP emitter and its window is converted from AlInP to GaInP. This modification eliminated the refractive index discontinuity at the window/emitter interface of the middle subcell, as more fully described in U.S. patent application Ser. No. 12/258,190, filed Oct. 24, 2008. Moreover, the window layer 110 is preferably doped three times that of the emitter 111 to move the Fermi level up closer to the conduction band and therefore create band bending at the window/emitter interface which results in constraining the minority carriers to the emitter layer.

In one embodiment of the present disclosure, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a may be composed of p++ AlGaAs, and layer 114b may be composed of n++ GaAs or GaInP.

In technical terms, one of the fundamental requirements is minimizing the density of defects in the crystal structure, such as recombination sites or threading dislocations that may appear at various points in the active regions of the subcells. These defects are caused by the physical stresses on the epitaxial layers as a result of the lattice mismatching between layers due to the introduction of the graded metamorphic layer in the design of inverted metamorphic solar cells and the stress introduced into the lattice mis-matched adjacent layers.

A requisite to minimize threading dislocation creation is to maintain two-dimensional as opposed to three-dimensional growth. This condition may be influenced by several growth conditions: for example, growth temperature, grading rate, V to III ratio, template off-cut, alloy and surfactant assisted growth. The subject of U.S. patent application Ser. Nos. 12/047,842 and 12/102,550 was the surfactant assisted growth of the metamorphic layer, or the adjacent or "barrier" layers around the metamorphic layer. The present application also provides one or more metamorphic layers, and the adjacent or "alpha" layers around the metamorphic layer.

One approach for maintaining the material quality of over substantially the entire surface area of the wafer, and thereby ensuring greater uniformity in electro-optical characteristics of each of the individual cells implemented on the wafer, as described in U.S. patent application Ser. No. 14/044,147, filed Oct. 2, 2013, now U.S. Pat. No. 9,691,928, hereby incorporated by reference, through introduction of a suitable dopant in (i) the graded metamorphic layer, and/or (ii) one or more of the adjacent layers to the graded metamorphic layer, which we designate as "alpha" layers. The use of the "alpha" terminology to designate such a layer is deliberately chosen so as to avoid the proposed layers being pigeonholed into comparisons with other layers that may have been disposed in similar positions in multijunction cells described in the literature if the adjective "barrier", "buffer" or another descriptive term referring to such layers were utilized. Identifying such layer as a distinct "alpha" layer, it is intended to signify that the alpha layer has a different and distinct composition from the directly adjacent layers. Thus, the introduction of the alpha layer into a solar cell is a distinctive feature of the present disclosure. By placing such a layer in the designated position in the illustrated embodiments, the alpha layer will be characterized to have a function and effect which results in a demonstrable improvement in the performance or other characteristic of the solar cell in which it is implemented, and specifically addresses the technical problems noted above.

In some embodiments a barrier or alpha layer 115, composed of n-type (Al)GaInP, is deposited over the tunnel diode 114a/114b, to a thickness of between 0.25 and 1 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115. Layer 116 is preferably a compositionally step-graded series of AlGaInAs layers, preferably with monotonically changing lattice constant, so as to achieve a gradual transition in lattice constant in the semiconductor structure from subcell B to subcell C while minimizing threading dislocations from occurring. In some embodiments, the band gap of layer 116 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_yAl_{1-y}As$, $0<x<1$, $0<y<1$ with x and y selected such that the band gap of the interlayer remains constant at approximately 1.50 eV or other appropriate band gap. In other embodiments, the graded interlayer is composed of $(In_xGa_{1-x})_yAl_{1-y}As$, with $0<x<1$, $0<y<1$, and x and y selected such that the band gap of the interlayer remains substantially constant at 1.6 eV or approximately 1.6 eV (e.g., in the range of 1.55 eV to 1.65 eV).

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded GaInP steps, with each step layer having a thickness of 0.25 micron. As a result, each layer of Wanlass et al. has a different band gap. In one embodiment of the present invention, the layer 116 is composed of a plurality of layers of AlGaInAs, with monotonically changing lattice constant, each layer having the same band gap, approximately 1.5 eV.

The advantage of utilizing a constant band gap material such as AlGaInAs is that arsenide-based semiconductor material is much easier to process from a manufacturing standpoint in standard commercial MOCVD reactors than materials incorporating phosphorus, while the small amount of aluminum in the band gap material assures radiation transparency of the metamorphic layers.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present disclosure, an optional second barrier layer 117 may be deposited over the AlGaInAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present disclosure.

On top of the window layer 118, the layers of cell C are deposited: the n+ emitter layer 119, and the p-type base layer 120. These layers are preferably composed of n+ type GaInAs and p+ type GaInAs respectively, or n+ type GaInP and p type GaInAs for a heterojunction subcell, although other suitable materials consistent with lattice constant and band gap requirements may be used as well.

A BSF layer 121, preferably composed of AlGaInAs, is then deposited on top of the cell C, the BSF layer performing the same function as the BSF layers 108 and 113.

Finally, a high band gap contact layer 122, preferably composed of p++ type InGaAlAs, is deposited on the BSF layer 121.

A metal contact layer 123 is deposited over the p++ semiconductor contact layer 122. The metal is typically the sequence of metal layers Ti/Au/Ag/Au.

Figure 1B:
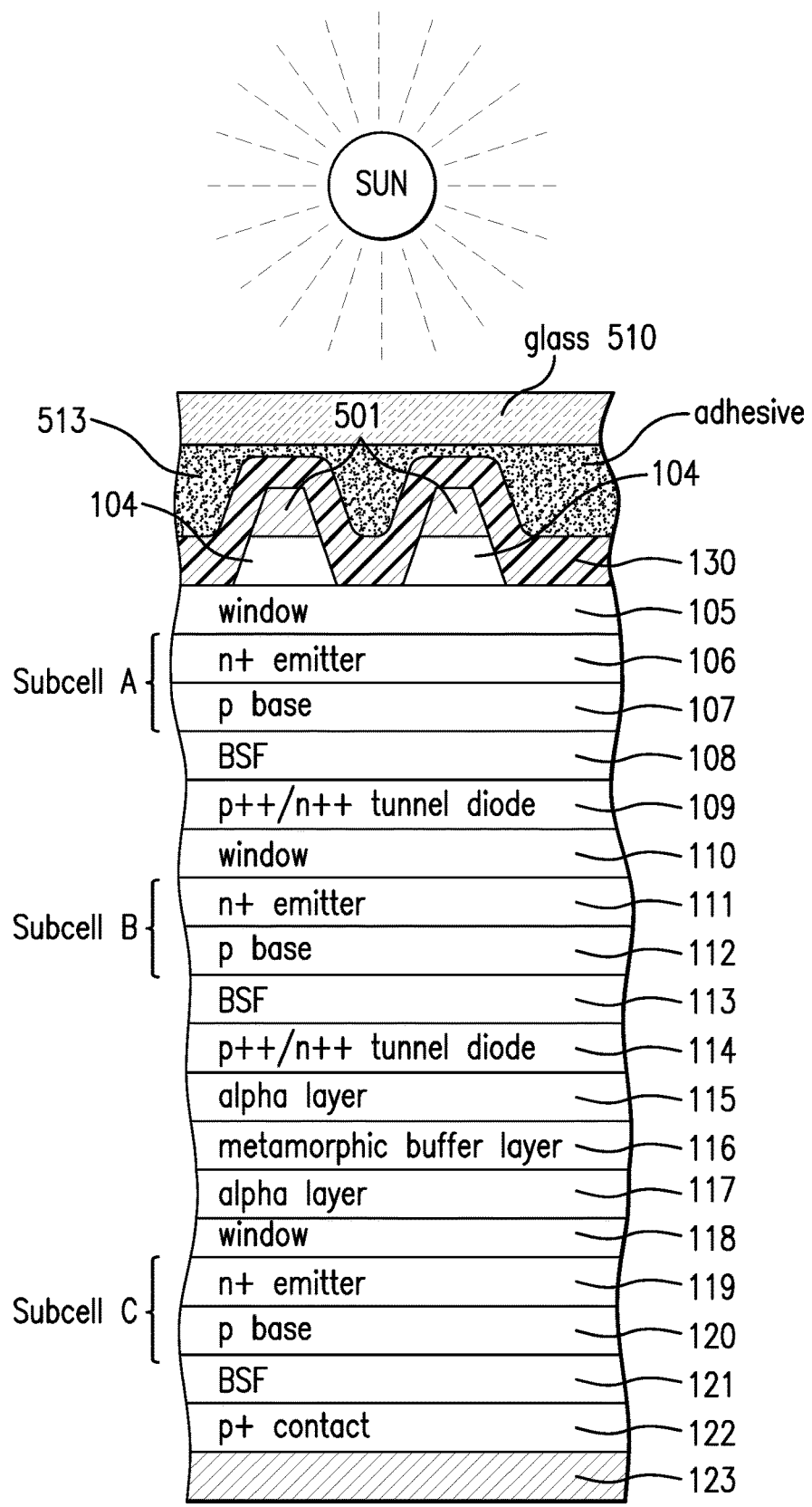
FIG. 1B is a cross-sectional view of the three junction solar cell of FIG. 1A after removal of the growth substrate and completion of fabrication.

FIG. 1B is a cross-sectional view of the three junction solar cell of FIG. 1A after removal of the growth substrate and completion of fabrication with the top subcell A at the top of the Figure, and the metal contact layer 123 at the bottom.

Grid lines 501 can be deposited via evaporation and lithographically patterned over contact layer 104, which is disposed on window layer 105. As illustrated in FIG. 1B, contact layer 104 has also been etched to the surface of window layer 105 using grid lines 501 as masks. Antireflective (ARC) dielectric coating layer 130 is disposed over the entire surface of the upper surface of subcell A including grid lines 501. A cover glass 510 is attached to the upper surface of the multijunction solar cell by adhesive 513.

Three Junction Embodiment

Figure 2A:
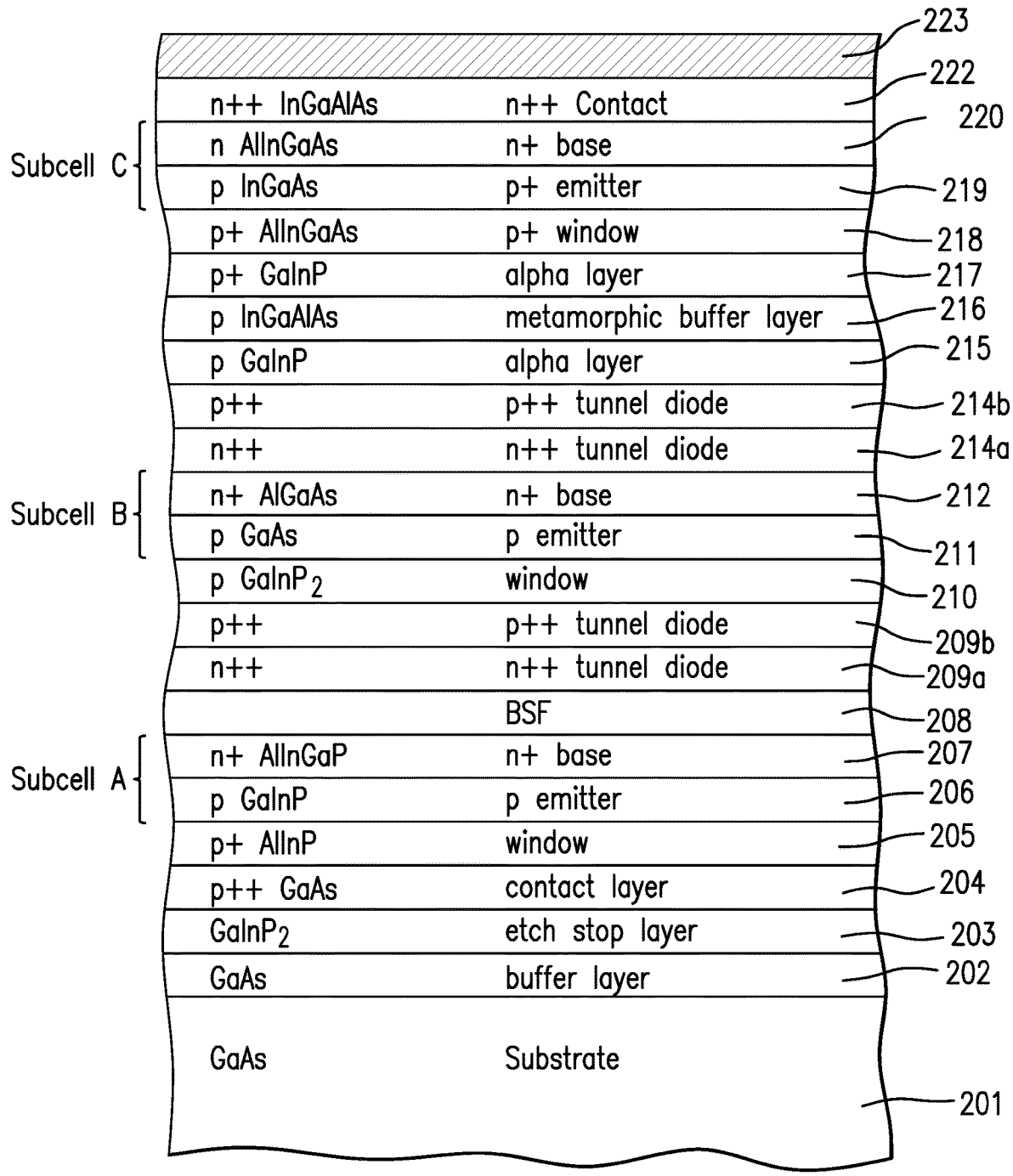
FIG. 2A is a cross-sectional view of the solar cell of one embodiment of a three junction p on n solar cell after an initial stage of fabrication including the deposition of certain semiconductor layers on the growth substrate according to the present disclosure.

FIG. 2A is a cross-sectional view of the solar cell of one embodiment of a three junction p on n solar cell after an initial stage of fabrication including the deposition of certain semiconductor layers on the growth substrate according to the present disclosure.

FIG. 2A depicts the sequential formation of the three subcells A, B and C on a GaAs growth substrate. More particularly, there is shown a substrate 201, which is preferably gallium arsenide (GaAs), but may also be germanium (Ge) or other suitable material. For GaAs, the substrate is preferably a 15 degrees off-cut substrate, that is to say, its surface is orientated 15 degrees off the (100) plane towards the (111)A plane, as more fully described in U.S. patent application Ser. No. 12/047,944, filed Mar. 13, 2008.

In the case of a Ge substrate, a nucleation layer (not shown) is deposited directly on the substrate 201. On the substrate, or over the nucleation layer (in the case of a Ge substrate), a buffer layer 202 and an etch stop layer 203 are further deposited. In the case of GaAs substrate, the buffer layer 202 is preferably GaAs. In the case of Ge substrate, the buffer layer 202 is preferably GaInAs. A contact layer 204 of GaAs is then deposited on layer 203, and a window layer 205 of AlInP is deposited on the contact layer. The subcell A, consisting of an p emitter layer 206 and a n+ type base layer 207, is then epitaxially deposited on the window layer 205. The subcell A is generally lattice matched to the growth substrate 201.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 206 is composed of GaInP and the base layer 207 is composed of AlGaInP. In some embodiments, more generally, the base-emitter junction may be a heterojunction. In other embodiments, the base layer may be composed of (Al)GaInP, where the aluminum or Al term in parenthesis in the preceding formula means that Al is an optional constituent, and in this instance may be used in an amount ranging from 0% to 30%. The doping profile of the emitter and base layers 206 and 207 according to the present disclosure will be discussed.

In some embodiments, the band gap of the base layer 207 is 1.91 eV or greater.

Subcell A will ultimately become the "top" subcell of the inverted metamorphic structure after completion of the process steps according to the present invention to be described hereinafter.

On top of the base layer 207 a back surface field ("BSF") layer 208 preferably AlGaInP may be deposited and used to reduce recombination loss.

The BSF layer 208 drives minority carriers from the region near the base/BSF interface surface to minimize the effect of recombination loss. In other words, the BSF layer 207 reduces recombination loss at the backside of the solar subcell A and thereby reduces the recombination in the base.

In some embodiments, the BSF layer 208 is not necessary and may be omitted, particularly if the emitter layer of the adjacent subcell is "optically thick". The expression "optically thick" refers to the subcell arrangement in which the base layer has a higher band gap than the emitter layer so that the base layer absorbs substantially no incident photons, and as a result does not generate any substantial photocurrent.

Thus, in one embodiment, the band gap of the base layer 207 is greater than that of the emitter layer 206, and the BSF layer is omitted. The omission of a BSF layer is one of the distinguishing structural features of the solar cell according to the present disclosure, and has important advantages in both lower cost (since neither the materials nor production time to produce such layer is required) and improved electrical characteristics (e.g., lower series resistance).

On top of the BSF layer 208 (if present), a sequence of heavily doped p-type and n-type layers 209a and 209b is deposited that forms a tunnel diode, i.e. an ohmic circuit element that forms an electrical connection between subcell A to subcell B. Layer 209 is preferably composed of n++ AlGaAs, and layer 209 is preferably composed of p++ GaInP.

On top of the tunnel diode layers 209 a window layer 210 is deposited, preferably p type GaInP. The advantage of utilizing GaInP as the material constituent of the window layer 110 is that it has an index of refraction that closely matches the adjacent emitter layer 211, as more fully described in U.S. patent application Ser. No. 12/258,190, filed Oct. 24, 2008. The window layer 210 used in the subcell B also operates to reduce the interface recombination loss. It should be apparent to one skilled in the art, that additional layer(s) may be added or deleted in the cell structure without departing from the scope of the present disclosure.

On top of the window layer 210 the layers of subcell B are deposited: the p-type emitter layer 211 and the n+ type base layer 212. These layers are preferably composed of GaInP and $GaIn_{0.0015}As$ respectively (for a Ge substrate or growth template), or GaInP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 211 and 212 according to the present disclosure will be subsequently discussed.

In some previously disclosed implementations of an inverted metamorphic solar cell, the middle cell was a homostructure. In some embodiments of the present disclosure, similarly to the structure disclosed in U.S. patent application Ser. No. 12/023,772, the middle subcell becomes a heterostructure with an GaInP emitter and its window is converted from AlInP to GaInP. This modification eliminated the refractive index discontinuity at the window/emitter interface of the middle subcell, as more fully described in U.S. patent application Ser. No. 12/258,190, filed Oct. 24, 2008. Moreover, the window layer 210 is in some embodiments doped three times that of the emitter 211 to move the Fermi level up closer to the conduction band and therefore create band bending at the window/emitter interface which results in constraining the minority carriers to the emitter layer.

In one embodiment of the present disclosure, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B are deposited the p++/n++ tunnel diode layers 214a and 214b respectively, similar to the layers 209a and 209b, forming an ohmic circuit element to connect subcell B to subcell C. The layer 214a may be composed of n++ AlGaAs, and layer 214b may be composed of p++ GaAs or GaInP.

Note that in this depicted embodiment, a BSF layer similar to that of layer 113 in FIG. 1A is not employed under the assumptions discussed in connection with the BSF layer 208 discussed in connection with subcell A.

In other embodiments, a BSF layer similar to that of layer 208 may be employed.

In technical terms, one of the fundamental requirements is minimizing the density of defects in the crystal structure, such as recombination sites or threading dislocations that may appear at various points in the active regions of the subcells. These defects are caused by the physical stresses on the epitaxial layers as a result of the lattice mismatching between layers due to the introduction of the graded metamorphic layer in the design of inverted metamorphic solar cells and the stress introduced into the lattice mis-matched adjacent layers.

A requisite to minimize threading dislocation creation is to maintain two-dimensional as opposed to three-dimensional growth. This condition may be influenced by several growth conditions: for example, growth temperature, grading rate, V to III ratio, template off-cut, alloy and surfactant assisted growth. The subject of U.S. patent application Ser. Nos. 12/047,842 and 12/102,550 was the surfactant assisted growth of the metamorphic layer, or the adjacent or "barrier" layers around the metamorphic layer. The present application also provides one or more metamorphic layers, and the adjacent or "alpha" layers around the metamorphic layer.

One approach for maintaining the material quality of over substantially the entire surface area of the wafer, and thereby ensuring greater uniformity in electro-optical characteristics of each of the individual cells implemented on the wafer, as described in U.S. patent application Ser. No. 14/044,147, filed Oct. 2, 2013, now U.S. Pat. No. 9,691,928, hereby incorporated by reference, through introduction of a suitable dopant in (i) the graded metamorphic layer, and/or (ii) one or more of the adjacent layers to the graded metamorphic layer, which we designate as "alpha" layers. The use of the "alpha" terminology to designate such a layer is deliberately chosen so as to avoid the proposed layers being pigeonholed into comparisons with other layers that may have been disposed in similar positions in multijunction cells described in the literature if the adjective "barrier", "buffer" or another descriptive term referring to such layers were utilized. Identifying such layer as a distinct "alpha" layer, it is intended to signify that the alpha layer has a different and distinct composition from the directly adjacent layers. Thus, the introduction of the alpha layer into a solar cell is a distinctive feature of the present disclosure. By placing such a layer in the designated position in the illustrated embodiments, the alpha layer will be characterized to have a function and effect which results in a demonstrable improvement in the performance or other characteristic of the solar cell in which it is implemented, and specifically addresses the technical problems noted above.

In some embodiments a barrier or alpha layer 215, composed of n-type (Al)GaInP, is deposited over the tunnel diode 214a/214b, to a thickness of between 0.25 and 1 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 216 is deposited over the alpha layer 215. Layer 216 is preferably a compositionally step-graded series of AlGaInAs layers, preferably with monotonically changing lattice constant, so as to achieve a gradual transition in lattice constant in the semiconductor structure from subcell B to subcell C while minimizing threading dislocations from occurring. In some embodiments, the band gap of layer 216 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap. In other embodiments, the graded interlayer is composed of $(In_xGa_{1-x})_yAl_{1-y}As$, with x and y selected such that the band gap of the interlayer remains substantially constant at 1.6 eV or approximately 1.6 eV (e.g., in the range of 1.55 eV to 1.65 eV).

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded GaInP steps, with each step layer having a thickness of 0.25 micron. As a result, each layer of Wanlass et al. has a different band gap. In one embodiment of the present invention, the layer 116 is composed of a plurality of layers of AlGaInAs, with monotonically changing lattice constant, each layer having the same band gap, approximately 1.5 eV.

The advantage of utilizing a constant band gap material such as AlGaInAs is that arsenide-based semiconductor material is much easier to process from a manufacturing standpoint in standard commercial MOCVD reactors than materials incorporating phosphorus, while the small amount of aluminum in the band gap material assures radiation transparency of the metamorphic layers.

Although one embodiment of the present disclosure utilizes a plurality of layers of AlGaInAs for the metamorphic layer 216 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present disclosure, an optional second alpha layer 217 may be deposited over the AlGaInAs metamorphic layer 216. The second alpha layer 217 will typically have a different composition than that of alpha layer 215, and performs essentially the same function of preventing threading dislocations from propagating. In one embodiment, alpha layer 217 is p+ type GaInP.

A window layer 218 preferably composed of p+ type GaInP is then deposited over the alpha layer 217 (or directly over layer 216, in the absence of a second alpha layer). This window layer operates to reduce the recombination loss in subcell "C". It should be apparent to one skilled in the art that additional layers may be added or deleted in the cell structure without departing from the scope of the present disclosure.

On top of the window layer 218, the layers of cell C are deposited: the p+ emitter layer 219, and the n+ type base layer 220. These layers are preferably composed of p+ type GaInAs and n+ type GaInAs respectively, or p+ type GaInP and n+ type GaInAs for a heterojunction subcell, although other suitable materials consistent with lattice constant and band gap requirements may be used as well.

A BSF layer is again not employed in this embodiment unlike the BSF layers 113 and 121 in FIG. 1A under the assumptions discussed in connection with the BSF layer 208 discussed in connection with the subcell A.

In other embodiments, a BSF layer similar to that of layer 208 may be employed.

Finally, a high band gap contact layer 222, preferably composed of n++ type InGaAlAs, is deposited on the base layer 220.

A metal contact layer 223 is deposited over the n++ semiconductor contact layer 222. The metal is typically the sequence of metal layers Ti/Au/Ag/Au.

It should be apparent to one skilled in the art that additional layer(s) may be added or deleted in the cell structure without departing from the scope of the present invention.

Figure 2B:
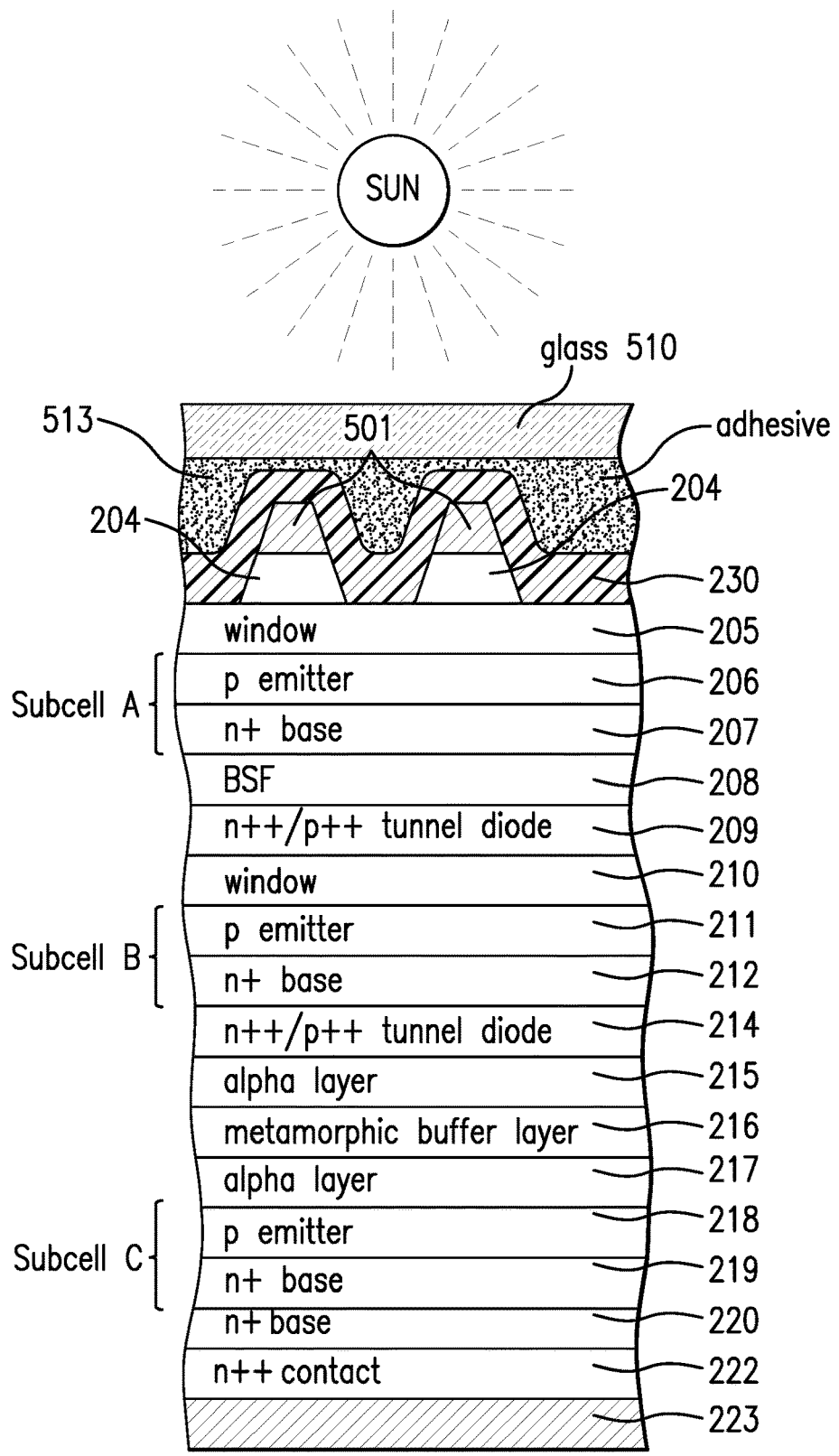
FIG. 2B is a cross-sectional view of the solar cell of FIG. 2A after completion of fabrication.

FIG. 2B is a cross-sectional view of the solar cell of FIG. 2A after removal of the growth substrate and completion of fabrication.

Grid lines 501 can be deposited via evaporation and lithographically patterned over contact layer 204, which is disposed on window layer 205. As illustrated in FIG. 2B, contact layer 204 has also been etched to the surface of window layer 205 using grid lines 501 as masks. Antireflective (ARC) dielectric coating layer 230 is disposed over the entire surface of the upper surface of subcell A including grid lines 501. A coverglass 510 is attached to the upper surface of the multijunction solar cell by adhesive 513.

Four Junction Embodiment

Figure 3A:
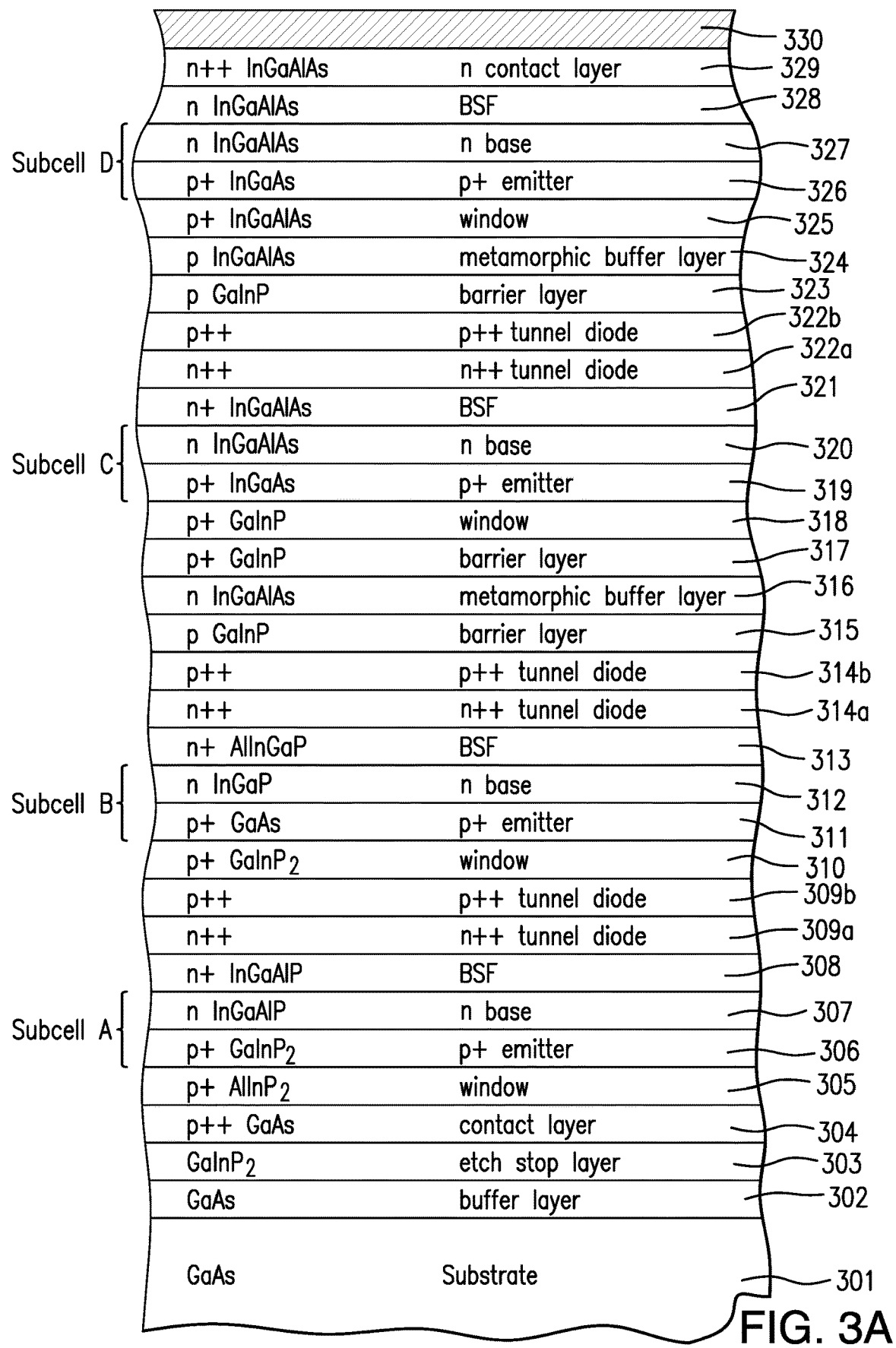
FIG. 3A is a cross-sectional view of the solar cell of one embodiment of a four junction p on n solar cell after an initial stage of fabrication including the deposition of certain semiconductor layers on the growth substrate according to the present disclosure.

FIG. 3A is a cross-sectional view of the solar cell of one embodiment of a four junction p on n solar cell after an initial stage of fabrication including the deposition of certain semiconductor layers on the growth substrate according to the present disclosure.

More particularly, FIG. 3A is a cross-sectional view of the solar cell in an embodiment of a four junction solar cell with two metamorphic layers. The layers 301 through 320 of this embodiment are substantially identical to those discussed in connection with the embodiment of FIG. 2A, and therefore in the interest of brevity of this disclosure, the description of such layers will not be repeated here.

As noted in connection with the BSF layer 208 in the triple junction embodiment in FIGS. 2A and 2B, the BSF layer associated with one, some, or all of the subcells in the p on n arrangement of the present disclosure is not necessary and may be omitted, particularly if the emitter layer of the adjacent subcell is "optically thick". The expression "optically thick" refers to the subcell arrangement in which the base layer has a higher band gap than the emitter layer so that the base layer absorbs substantially no incident photons, and as a result does not generate any substantial photocurrent.

Figure 3B:
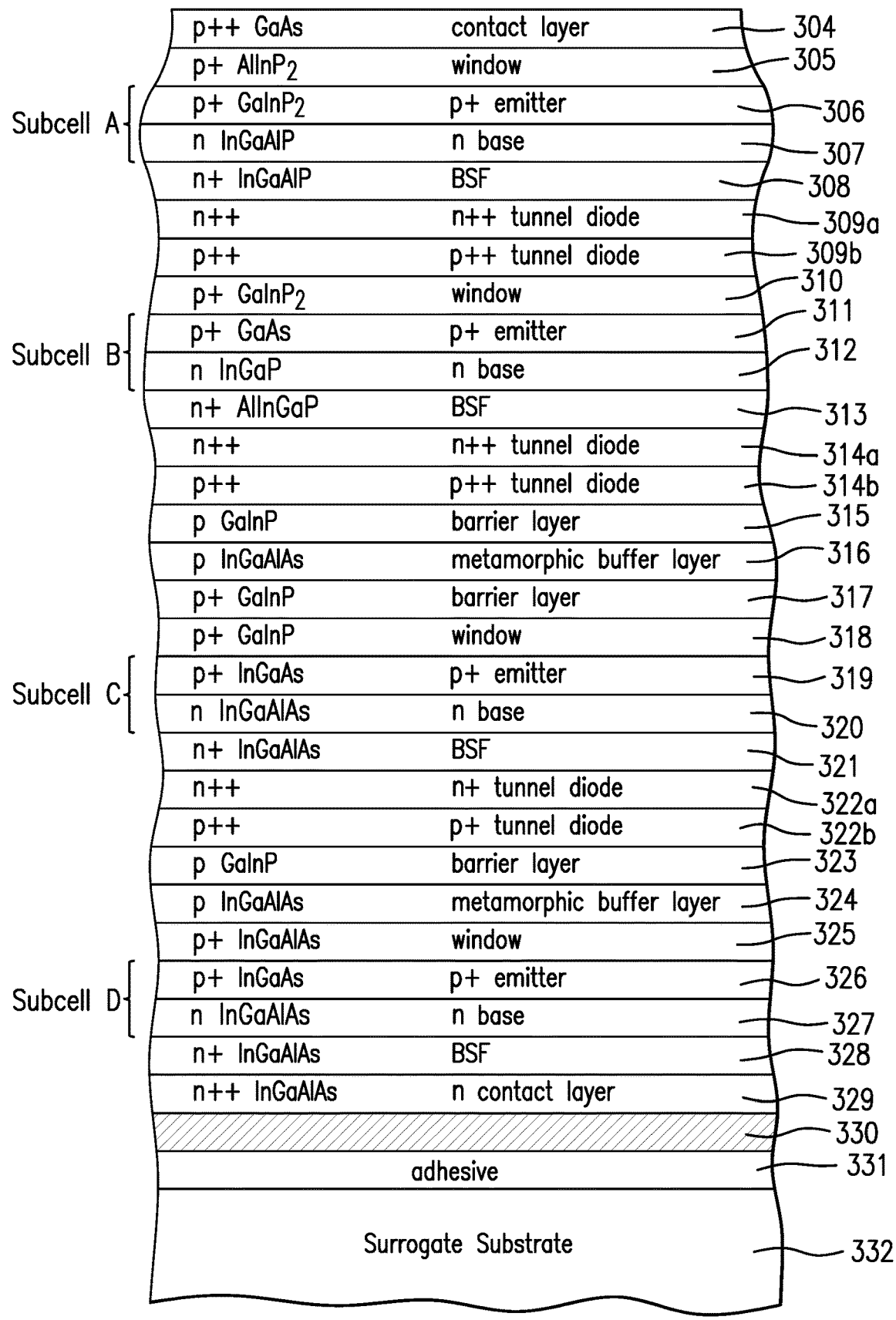
FIG. 3B is a cross-sectional view of the solar cell of FIG. 3A after completion of fabrication up to the contact layer of the top subcell.

Although the BSF layers 308, 313, 321 and 328 are illustrated in FIGS. 3A and 3B to suggest that one or more such BSF layers may be included, as noted above, they are optional. Thus, in one embodiment, the band gap of the base layer 320 is greater than that of the emitter layer 319, and the BSF layer 321 is omitted. The omission of a BSF layer is one of the distinguishing structural features of the solar cell according to the present disclosure, and has important advantages in both lower cost (since neither the materials nor production time to produce such layer is required) and improved electrical characteristics (e.g., lower series resistance).

The p++/n++ tunnel diode layers 322a and 322b respectively are deposited over the base 320 of subcell C, similar to the layers 314a and 314b, forming an ohmic circuit element to connect subcell C to subcell D. The layer 322a is composed of n++ AlGaInAs, and layer 322b is composed of p++ GaInP.

In some embodiments a barrier or alpha layer 323, preferably composed of p-type GaInP, is deposited over the tunnel diode 322a/322b, to a thickness between 0.25 and 1.0 micron, and in some embodiments about 0.5 micron. Such alpha layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A metamorphic layer (or graded interlayer) 324 is deposited over the alpha layer 323. Layer 324 is preferably a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. In some embodiments the band gap of layer 324 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap.

A window layer 325 preferably composed of p+ type AlGaInAs is then deposited over layer 324 (or over a second barrier or alpha layer, if there is one, disposed over layer 324,). This window layer operates to reduce the recombination loss in the fourth subcell "D". It should be apparent to one skilled in the art that additional layers may be added or deleted in the cell structure without departing from the scope of the present invention.

On top of the window layer 325, the layers of cell D are deposited: the p+ emitter layer 326, and the n-type base layer 327. These layers are preferably composed of p+ type GaInAs and n type AlInGaAs respectively, although other suitable materials consistent with lattice constant and band gap requirements may be used as well.

Finally a high band gap contact layer 329, preferably composed of n++ type AlGaInAs, is deposited on the base 327 of subcell D.

A metal contact layer 330 is deposited over the n++ semiconductor contact layer 329. The metal is the sequence of metal layers Ti/Au/Ag/Au.

It should be apparent to one skilled in the art, that additional layer(s) may be added or deleted in the cell structure without departing from the scope of the present invention.

The process by which the original substrate 301 is then removed by a sequence of lift-off, lapping and/or etching steps in which the substrate 301, and the buffer layer 303 are removed and subsequent process steps are similar to that of the solar cell of FIGS. 1A and 1B, and in the interest of brevity will not be illustrated or described herein.

FIG. 3B is a cross-sectional view of the solar cell of FIG. 3A after completion of fabrication described in the preceding paragraphs including attachment of a surrogate substrate 132 with the orientation with the metal contact layer 330 being at the bottom of the Figure.

For the sake of brevity of this application, illustrations of the subsequent processing steps including removal of the growth substrate, formation of grid lines, deposition of an antireflective (ARC) dielectric coating layer and attachment of a cover glass as described and illustrated in connection with a 3J or 4J solar cell depicted in FIGS. 1B and 2B will not be presented in connection with the embodiment of FIG. 3B (or in subsequently illustrated embodiments) since such process steps are substantially similar to those previously described.

Figure 4A:
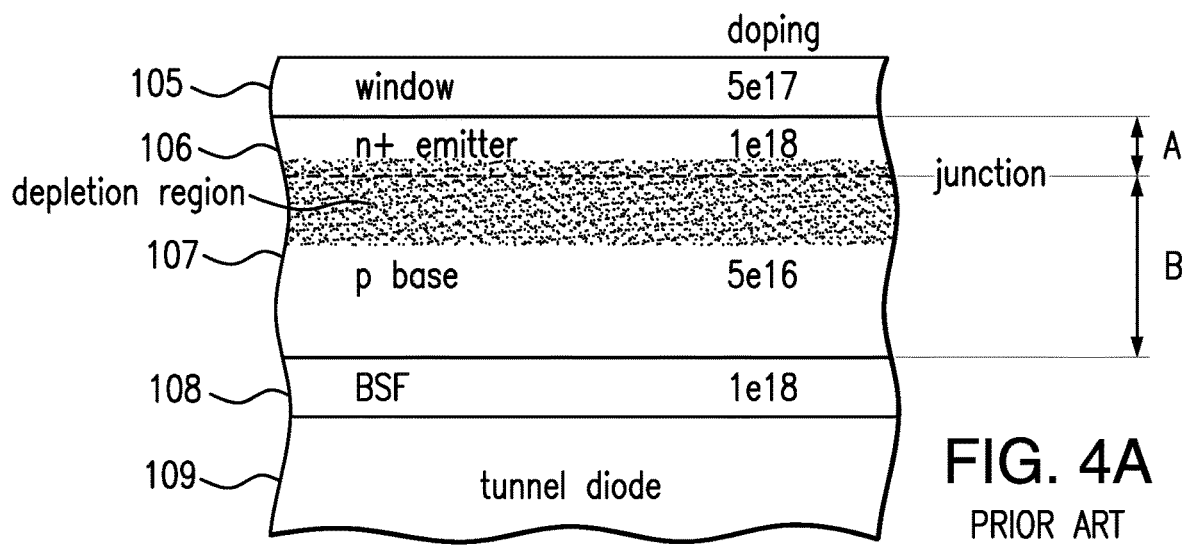
FIG. 4A is a simplified cross-sectional view of a typical n on p solar cell depicting the relative thickness of the emitter and base layers, and the doping in such layers.

FIG. 4A is a simplified cross-sectional view of a typical n on p solar cell depicting the relative thickness of the emitter and base layers, and the doping in such layers.

In particular, there is depicted a window layer 105 disposed above a subcell 106/107 substantially similar to the top subcell in the solar cell of FIG. 1B. The n+ emitter 106 typically has a thickness A in the range of 20 to 200 nm. The p type base 107 typically has a thickness B in the range of 200 to 900 nm. The depletion region around the p-n junction is depicted as a shaded region, and is relatively narrow in the emitter region 106 and larger in the base region 107.

Below the base region 107 is a BSF layer 108, and below the BSF layer 108 is the tunnel diode 109. The doping of the window 105 is typically 5E17 free carriers per cubic centimeter, the doping of the emitter is typically 1E18 free carriers per cubic centimeter, the doping of the base is typically 5E16 free carriers per cubic centimeter, and the doping of the BSF layer is typically 1E18 free carriers per cubic centimeter.

Figure 4B:
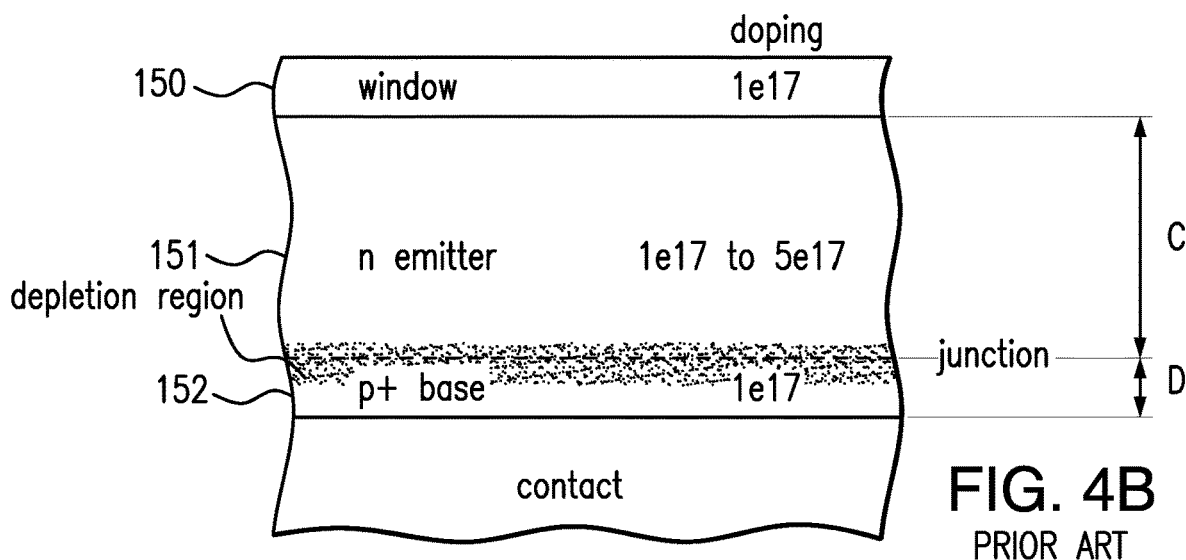
FIG. 4B is a simplified cross-sectional view of a portion of an n on p solar cell as described in the Geisz et al reference depicting the relative thickness of the emitter and base layers, and the doping in such layers.

FIG. 4B is a simplified cross-sectional view of a portion of an n on p solar cell as described in the Geisz et al reference depicting the relative thickness of the emitter and base layers, and the doping in such layers. In particular, there is depicted a window layer 150 disposed over a subcell 151/152. The n type emitter 151 of the subcell has a thickness C in the range of 80 to 900 nm. The p+ type base 152 has a thickness D in the range of 20 to 200 nm. A contact layer 154 is disposed below the base 152.

The doping of the window layer 150 is typically 1E17 free carriers per cubic centimeter, then doping of the emitter is typically 5E17 free carriers per cubic centimeter, and the doping of the base is typically 1E17 free carriers per cubic centimeter.

Figure 4C:
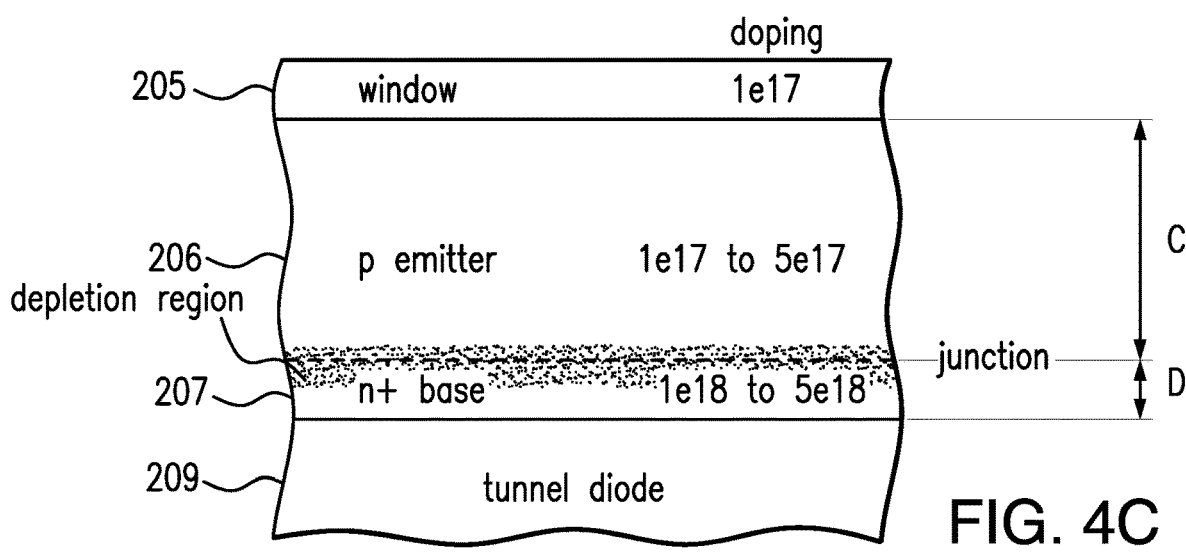
FIG. 4C is a simplified cross-sectional view of an p on n solar cell according to the present disclosure depicting the relative thickness of the emitter and base layers, and the doping in such layers.

FIG. 4C is a simplified cross-sectional view of an p on n solar cell according to the present disclosure depicting the relative thickness of the emitter and base layers, and the doping in such layers, and the doping in such layers. In particular, there is depicted a window layer 205 disposed over a subcell 206/207. The p type emitter 206 of the subcell has a thickness C in the range of 250 to 3000 nm. The n+ type base 207 has a thickness D in the range of 50 to 200 nm.

A tunnel diode 209 is disposed directly below the base 207, with no BSF layer in some embodiments.

The doping of the window layer 205 is typically 1E17 free carriers per cubic centimeter, while the doping of the emitter and the base will be discussed in connection with FIG. 5.

Figure 5:
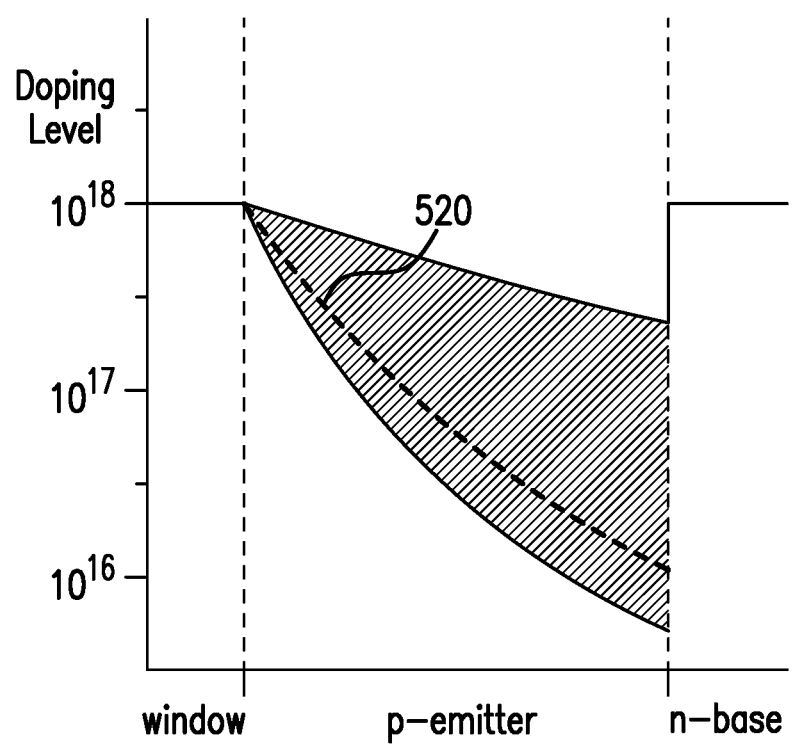
FIG. 5 is a graph of the doping profile of the emitter and base layers of a subcell of the solar cell according to the present disclosure.

FIG. 5 is a graph of the doping profile of the emitter and base layers of a subcell of the solar cell according to the present disclosure.

As depicted in the FIG. 5, the emitter of the upper first solar subcell has a gradation in doping from the top of the emitter, (i.e., adjacent to the window layer) from approximately $1 \times 10^{18}$ free carriers per cubic centimeter to the bottom of the emitter, (i.e., directly disposed over the base region) in which the doping is in the range of $5 \times 10^{15}$ free carriers per cubic centimeter to $1 \times 10^{16}$ free carriers per cubic centimeter. As illustrated in the Figure, the gradation may lie anywhere within the shaded region, and may be linear, non-linear, or step-wise in shape. As an example of one such gradation in doping, the dashed line 520 presents one such doping profile.

As further indicated in the Figure, the doping level in the window layer is typically constant at $1 \times 10^{18}$ free carriers per cubic centimeter, as is the doping level in the base layer.

Five Junction Embodiment

Figure 6A:
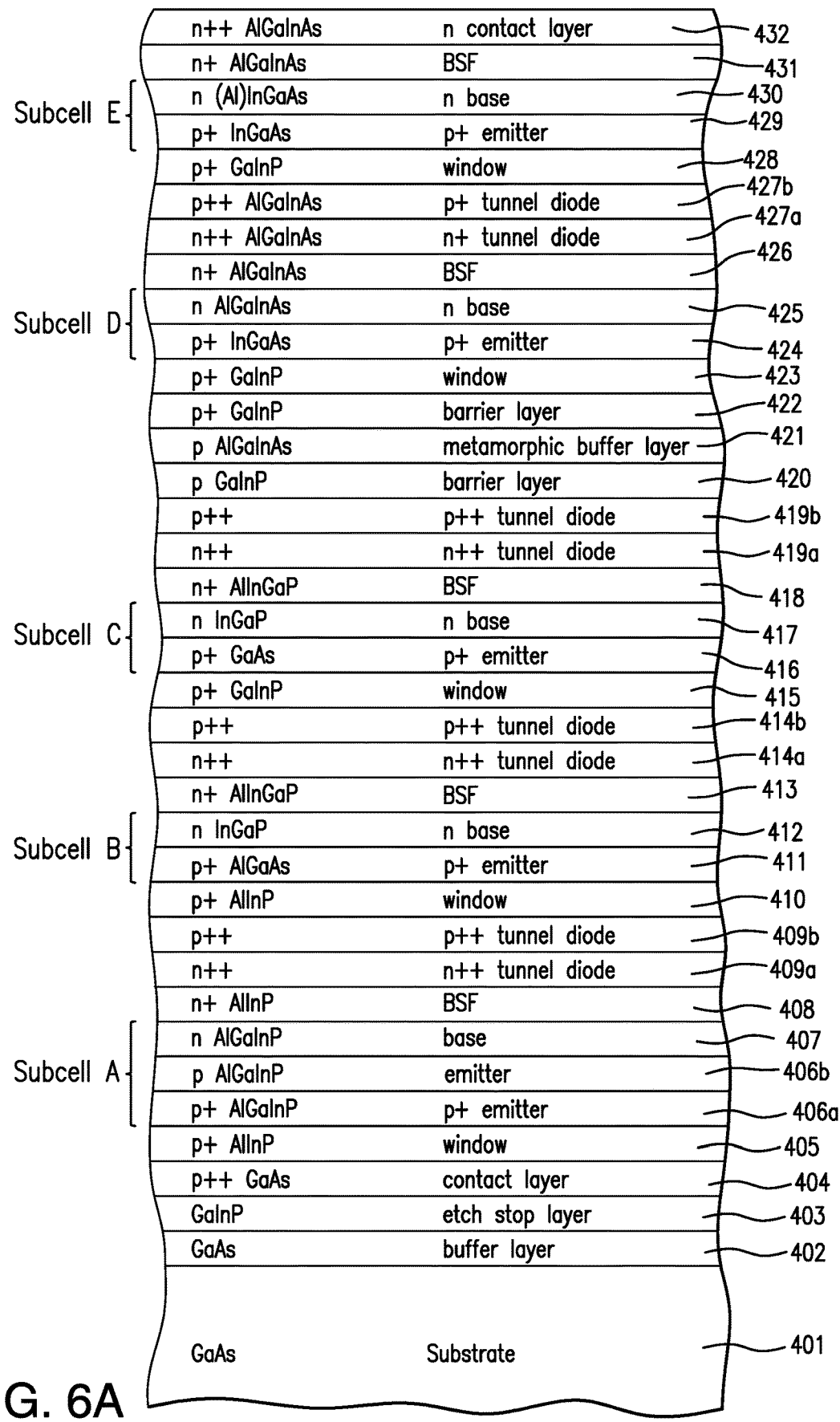
FIG. 6A is a cross-sectional view of the solar cell of one embodiment of a five junction solar cell according to the present disclosure after an initial stage of fabrication including the deposition of certain semiconductor layers on the growth substrate.

FIG. 6A is a cross-sectional view of one embodiment of a five junction p on n solar cell with one metamorphic layer after an initial stage of fabrication including the deposition of certain semiconductor layers on the growth substrate according to the present disclosure.

The layers 401 through 414b of this embodiment are substantially identical to those discussed in connection with layers 301 through 314b in the embodiment of FIG. 3A, and therefore in the interest of brevity of this disclosure, the description of such layers will not be repeated here.

Although the BSF layers 408, 413, 418, 426 and 431 are illustrated in FIG. 6A to suggest that one or more may be included, as noted above, they are optional. Thus, in one embodiment, the band gap of the base layer 412 is greater than that of the emitter layer 411, and the BSF layer 413 is omitted. The omission of a BSF layer is one of the distinguishing structural features of the solar cell according to the present disclosure, and has important advantages in both lower cost (since neither the materials nor production time to produce such layer is required) and improved electrical characteristics (e.g., lower series resistance).

A window layer 415 preferably composed of p+ type GaInP is deposited over the tunnel diode layers 414a/414b.

This window layer 415 operates to reduce the recombination loss in subcell "C". It should be apparent to one skilled in the art that additional layers may be added or deleted in the cell structure without departing from the scope of the present disclosure.

On top of the window layer 415, the layers of cell C are deposited: the p+ emitter layer 416, and the n-type base layer 417. These layers are preferably composed of p+ type GaAs and n type InGaP respectively, although other suitable materials consistent with lattice constant and band gap requirements may be used as well.

A BSF layer 418, preferably composed of AlInGaP, may then be deposited on top of the cell C, the BSF layer 418 performing the same function as the BSF layers 408 and 413. In some embodiments, a BSF layer is not necessary and may be omitted particularly if the emitter layer of the adjacent subcell is "optically thick". The expression "optically thick" refers to the subcell arrangement in which the base layer has a higher band gap than the emitter layer so that the base layer absorbs substantially no incident photons, and as a result does not generate any substantial photocurrent.

The omission of a BSF layer is one of the distinguishing structural features of the solar cell according to the present disclosure, and has important advantages in both lower cost (since neither the materials nor production time to produce such layer is required) and improved electrical characteristics (e.g., lower series resistance).

The n++/p++ tunnel diode layers 419a and 419b respectively are deposited over the base layer 417 of subcell C, similar to the layers 414a and 414b, forming an ohmic circuit element to connect subcell C to subcell D. The layer 419a is composed of n++ AlGaInAs, and layer 419b is composed of p++ GaInP.

In some embodiments a barrier or alpha layer 420, preferably composed of p-type GaInP, is deposited over the tunnel diode 419a/419b, to a thickness of between 0.25 and 1.0 micron. Such barrier layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A metamorphic layer (or graded interlayer) 421 is deposited over the barrier layer 423. Layer 421 is preferably a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. In some embodiments the band gap of layer 421 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-x})y\ Al_{1-y}As$, with $0<x<1$, $0<y<1$, and x and y selected such that the band gap of the interlayer remains constant at approximately 1.1 eV or other appropriate band gap. In some embodiments, a second alpha layer 422 may be deposited over layer 421.

A window layer 423 preferably composed of p+ type AlGaInAs is then deposited over layer 421 (or over a second barrier layer 422, if there is one, disposed over layer 421). This window layer operates to reduce the recombination loss in the fourth subcell "D". It should be apparent to one skilled in the art that additional layers may be added or deleted in the cell structure without departing from the scope of the present invention.

On top of the window layer 423, the layers of cell D are deposited: the p+ emitter layer 424, and the n-type base layer 425. These layers are preferably composed of p+ type GaInAs and n type GaInAs respectively, although other suitable materials consistent with lattice constant and band gap requirements may be used as well.

The p++/n++ tunnel diode layers 427a and 427b respectively are deposited over the base layer 425 of subcell D, similar to the layers 419a and 419b, forming an ohmic circuit element to connect subcell D to subcell E. The layer 427a is composed of n++ AlGaInAs, and layer 427b is composed of p++ GaInP.

A window layer 428 preferably composed of p+ type AlGaInAs is then deposited over layer 427b. This window layer operates to reduce the recombination loss in the fifth subcell "E". It should be apparent to one skilled in the art that additional layers may be added or deleted in the cell structure without departing from the scope of the present invention.

On top of the window layer 428, the layers of cell E are deposited: the p+ emitter layer 429, and the n-type base layer 430. These layers are preferably composed of p+ type GaInAs and n type GaInAs respectively, although other suitable materials consistent with lattice constant and band gap requirements may be used as well.

Finally a high band gap contact layer 432, preferably composed of n++ type AlGaInAs, is deposited on the base layer 430.

A metal contact layer (not shown) is deposited over the n+ semiconductor contact layer 432. The metal is the sequence of metal layers Ti/Au/Ag/Au.

It should be apparent to one skilled in the art, that additional layer(s) may be added or deleted in the cell structure without departing from the scope of the present invention.

Following the fabrication of the structure shown in FIG. 6A, the original substrate 401 is then removed by a sequence of lift-off, lapping and/or etching steps with a resulting configuration similar to that described and depicted in the solar cell of FIG. 3B. In the interest of brevity, such configuration will not be illustrated or described herein.

As described in connection with FIGS. 1B and 2B, additional process steps such as the formation of grid lines, deposition of an antireflective (ARC) dielectric coating layer, and mounting of a cover glass 510 to the top of the solar cell would follow, but in the interest of brevity, such finishing process steps and configuration will not be illustrated in this or in the embodiments depicted in the subsequent Figures for brevity.

Figure 6B:
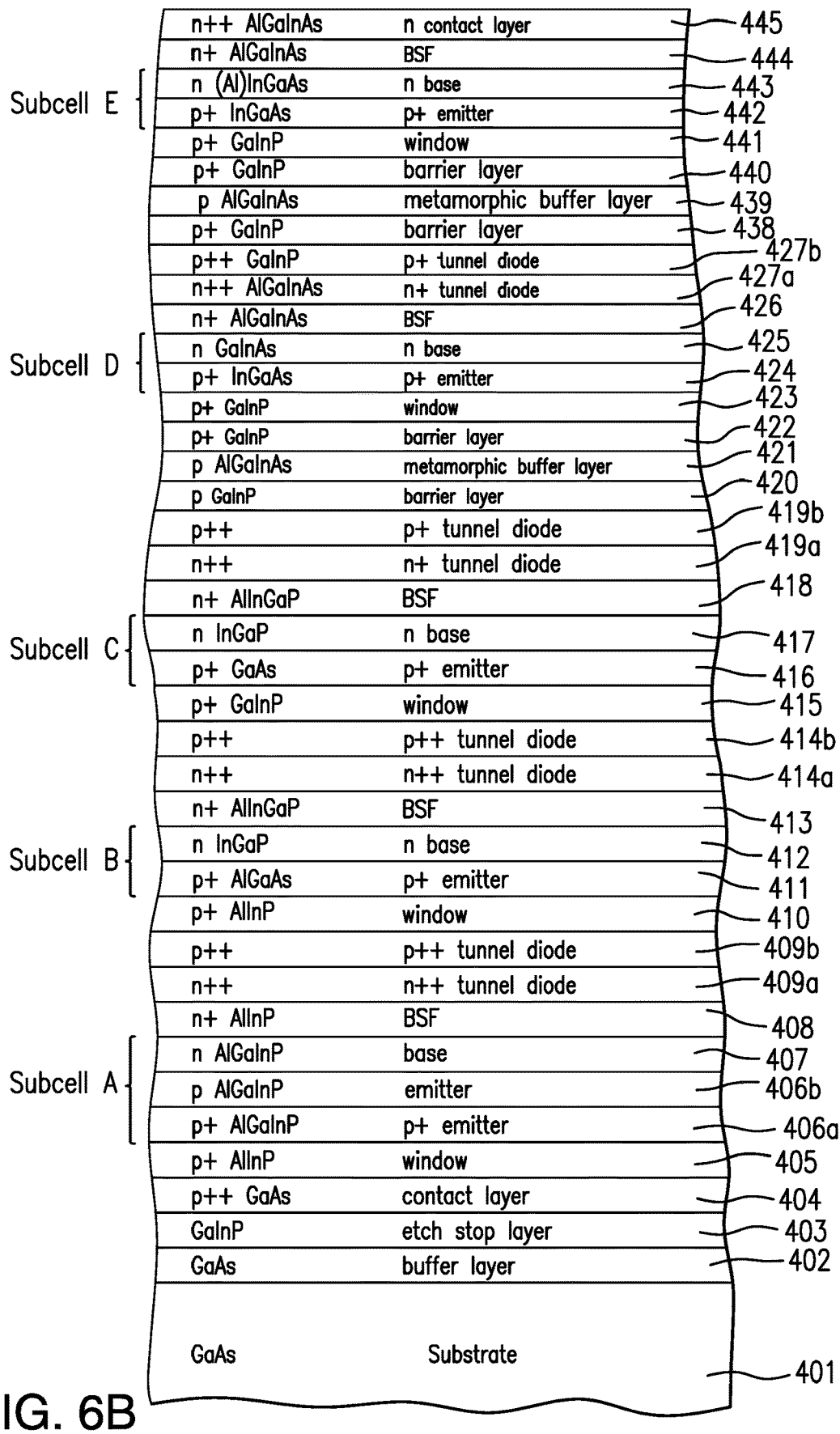
FIG. 6B is a cross-sectional view of the solar cell of a second embodiment of a five junction solar cell according to the present disclosure after an initial stage of fabrication including the deposition of certain semiconductor layers on the growth substrate.

FIG. 6B is a cross-sectional view of the solar cell of one embodiment of a five junction solar cell with two metamorphic layers according to the present disclosure after an initial stage of fabrication including the deposition of certain semiconductor layers on the growth substrate.

The layers 401 through 427b of this embodiment are substantially identical to those discussed in connection with layers 401 through 427b in the embodiment of FIG. 6A, and therefore in the interest of brevity of this disclosure, the description of such layers will not be repeated here.

Although the BSF layers 408, 413, 418, 426 and 444 are illustrated in FIG. 6B to suggest that one or more such BSF layers may be included, as noted above, they are optional. Thus, in one embodiment, the band gap of the base layer 443 is greater than that of the emitter layer 442, and the BSF layer 444 is omitted. As previously noted, the omission of a BSF layer is one of the distinguishing structural features of the solar cell according to the present disclosure, and has important advantages in both lower cost (since neither the materials nor the production time to produce such layer is required) and improved electrical characteristics (e.g., lower series resistance).

In some embodiments a barrier or alpha layer 438, preferably composed of p-type GaInP, is deposited over the tunnel diode 427a/427b, to a thickness of between 0.25 and 1.0 micron. Such barrier layer is intended to prevent threading dislocations from propagating, either opposite to the direction of growth into the top and middle subcells A, B, C and D or in the direction of growth into the subcell E, and is more particularly described in copending U.S. patent application Ser. No. 11/860,183, filed Sep. 24, 2007.

A metamorphic layer (or graded interlayer) 439 is deposited over the barrier layer 438. Layer 439 is preferably a compositionally step-graded series of AlGaInAs layers, preferably with monotonically changing lattice constant, so as to achieve a gradual transition in lattice constant in the semiconductor structure from subcell D to subcell E while minimizing threading dislocations from occurring. In some embodiments the band gap of layer 439 is constant throughout its thickness, preferably approximately equal to 1.1 eV, or otherwise consistent with a value slightly greater than the band gap of the third middle subcell D. One embodiment of the graded interlayer may also be expressed as being composed of (InxGa1-x)y Al1-yAs, with 0<x<1, 0<y<1, and x and y selected such that the band gap of the interlayer remains constant at approximately 1.1 eV or other appropriate band gap. In some embodiments, a second barrier layer 440 may be deposited over layer 439.

A window layer 441 preferably composed of p+ type AlGaInAs is then deposited over layer 440. This window layer operates to reduce the recombination loss in the fourth subcell "D". It should be apparent to one skilled in the art that additional layers may be added or deleted in the cell structure without departing from the scope of the present invention.

On top of the window layer 423, the layers of cell E are deposited: the p+ emitter layer 442, and the n-type base layer 443. These layers are preferably composed of p+ type InGaAs and n type (Al)InGaAs respectively, although other suitable materials consistent with lattice constant and band gap requirements may be used as well.

Finally a high band gap contact layer 445, preferably composed of n++ type AlGaInAs, is deposited on the base layer 443.

It should be apparent to one skilled in the art, that additional layer(s) may be added or deleted in the cell structure without departing from the scope of the present invention.

A metal contact layer (not shown) is deposited over the n+ semiconductor contact layer 445. The metal is the sequence of metal layers Ti/Au/Ag/Au.

Following the fabrication of the structure shown in FIG. 6B, the original substrate 401 is then removed by a sequence of lift-off, lapping and/or etching steps with a resulting configuration similar to that described and depicted in the solar cell of FIG. 3B. In the interest of brevity, such configuration will not be illustrated or described herein.

FIG. 6C is a cross-sectional view of the solar cell of a second embodiment of a five junction solar cell with three metamorphic layers after an initial stage of fabrication including the deposition of certain semiconductor layers on the growth substrate.

FIG. 6C is a cross-sectional view of the solar cell in an embodiment of a five junction solar cell with three metamorphic layers according to the present disclosure. The layers 201 through 263 of this embodiment are substantially identical to those discussed in connection with layers 301 through 327 in the embodiment of FIG. 3A, and therefore in the interest of brevity of this disclosure, the description of such layers will not be repeated here.

Although the BSF layers 208, 213, 256, 264 and 272 are illustrated in FIG. 6C to suggest that one or more such BSF layers may be included, as noted above, they are optional. Thus, in one embodiment, the band gap of the base layer 271 is greater than that of the emitter layer 270, and the BSF layer 272 is omitted. As previously noted, the omission of a BSF layer is one of the distinguishing structural features of the solar cell according to the present disclosure, and has important advantages in both lower cost (since neither the materials nor the production time to produce such layer is required) and improved electrical characteristics (e.g., lower series resistance).

The n++/p++ tunnel diode layers 265a and 265b respectively are deposited over the base layer 263 of subcell D, similar to the layers 257a and 257b, forming an ohmic circuit element to connect subcell D to subcell E. The layer 265a is composed of n++ AlGaInAs, and layer 265b is composed of p++ AlGaInAs.

In some embodiments a barrier or alpha layer 266, preferably composed of p-type GaInP, is deposited over the tunnel diode 265a/265b, to a thickness between 0.25 and 1.0 micron. Such barrier layer is intended to prevent threading dislocations from propagating, either opposite to the direction of growth into the middle subcells A, B, C and D, or in the direction of growth into the subcell E, and is more particularly described in copending U.S. patent application Ser. No. 11/860,183, filed Sep. 24, 2007.

A metamorphic layer (or graded interlayer) 267 is deposited over the barrier layer 266. Layer 267 is preferably a compositionally step-graded series of AlGaInAs layers, preferably with monotonically changing lattice constant, so as to achieve a gradual transition in lattice constant in the semiconductor structure from subcell D to subcell E while minimizing threading dislocations from occurring. In some embodiments the band gap of layer 267 is constant throughout its thickness, preferably approximately equal to 1.1 eV, or otherwise consistent with a value slightly greater than the band gap of the third middle subcell D. One embodiment of the graded interlayer may also be expressed as being composed of (InxGa1-x)y Al1-yAs, with x and y selected such that the band gap of the interlayer remains constant at approximately 1.1 eV or other appropriate band gap. In some embodiments, a second barrier layer 268 may be deposited over layer 267.

A window layer 269 preferably composed of p+ type GaInP is then deposited over the second barrier layer 268, if there is one, disposed over layer 267. This window layer operates to reduce the recombination loss in the fifth subcell "E". It should be apparent to one skilled in the art that additional layers may be added or deleted in the cell structure without departing from the scope of the present invention.

On top of the window layer 269, the layers of cell E are deposited: the p+ emitter layer 270, and the n-type base layer 271. These layers are preferably composed of p+ type InGaAs and n type (Al)InGaAs respectively, although other suitable materials consistent with lattice constant and band gap requirements may be used as well.

Finally a high band gap contact layer 273, preferably composed of n++ type AlGaInAs, is deposited on the base layer 271.

It should be apparent to one skilled in the art, that additional layer(s) may be added or deleted in the cell structure without departing from the scope of the present invention.

A metal contact layer (not shown) is deposited over the n+ semiconductor contact layer 273. The metal is the sequence of metal layers Ti/Au/Ag/Au.

Following the fabrication of the structure shown in FIG. 6C, the original substrate 201 is then removed by a sequence of lift-off, lapping and/or etching steps with a resulting configuration similar to that described and depicted in the solar cell of FIG. 3B. In the interest of brevity, such configuration will not be illustrated or described herein.

Six Junction Embodiment

FIG. 7A is a cross-sectional view of the solar cell of one embodiment of a six junction solar cell after an initial stage of fabrication including the deposition of certain semiconductor layers on the growth substrate.

FIG. 7A is a cross-sectional view of the solar cell in an embodiment of a six junction solar cell with two metamorphic layers according to the present disclosure. The layers 501 through 527b of this embodiment are substantially identical to those discussed in connection with layers 401 through 427b in the embodiment of FIG. 6B, and therefore in the interest of brevity of this disclosure, the description of such layers will not be repeated here.

Although the BSF layers 508, 513, 518, 526, 531 and 538 are illustrated in FIG. 7A to suggest that one or more such BSF layers may be included, as noted above, they are optional. Thus, in one embodiment, the band gap of the base layer 537 is greater than that of the emitter layer 536, and the BSF layer 538 is omitted. As previously noted, the omission of a BSF layer is one of the distinguishing structural features of the solar cell according to the present disclosure, and has important advantages in both lower cost (since neither the materials nor the production time to produce such layer is required) and improved electrical characteristics (e.g., lower series resistance).

A window layer 528 preferably composed of p+ type AlGaInAs is deposited over layer 527b. This window layer operates to reduce the recombination loss in the fifth subcell "E". It should be apparent to one skilled in the art that additional layers may be added or deleted in the cell structure without departing from the scope of the present invention.

On top of the window layer 528, the layers of cell E are deposited: the p+ emitter layer 529, and the n-type base layer 530. These layers are preferably composed of p+ type GaInAs and n type (Al)GaInAs respectively, although other suitable materials consistent with lattice constant and band gap requirements may be used as well.

The p++/n++ tunnel diode layers 532a and 532b respectively are deposited over the base layer 530 of subcell E, forming an ohmic circuit element to connect subcell E to subcell F. The layer 532 is composed of n++ AlGaInAs, and layer 532 is composed of p++ AlGaInAs.

In some embodiments a barrier or alpha layer 533, preferably composed of p-type GaInP, is deposited over the tunnel diode 532a/532b, to a thickness of between 0.25 and 1.0 micron. Such barrier layer is intended to prevent threading dislocations from propagating, either opposite to the direction of growth into the top and middle subcells A, B, C, D and E, or in the direction of growth into the subcell F, and is more particularly described in copending U.S. patent application Ser. No. 11/860,183, filed Sep. 24, 2007.

A metamorphic layer (or graded interlayer) 534 is deposited over the barrier layer 533. Layer 534 is preferably a compositionally step-graded series of AlGaInAs layers, preferably with monotonically changing lattice constant, so as to achieve a gradual transition in lattice constant in the semiconductor structure from subcell E to subcell F while minimizing threading dislocations from occurring. In some embodiments the band gap of layer 534 is constant throughout its thickness, preferably approximately equal to 1.1 eV, or otherwise consistent with a value slightly greater than the band gap of the third middle subcell E. One embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap. In some embodiments, a second barrier layer (not shown) may be deposited over layer 534.

A window layer 535 preferably composed of p+ type AlGaInAs is then deposited over layer 534. This window layer operates to reduce the recombination loss in the sixth subcell "F". It should be apparent to one skilled in the art that additional layers may be added or deleted in the cell structure without departing from the scope of the present invention.

On top of the window layer 535, the layers of cell F are deposited: the p+ emitter layer 536, and the n-type base layer 537. These layers are preferably composed of p+ type GaInAs and n type (Al)GaInAs respectively, although other suitable materials consistent with lattice constant and band gap requirements may be used as well.

Finally a high band gap contact layer 539, preferably composed of n++ type AlGaInAs, is deposited on the base layer 537.

It should be apparent to one skilled in the art, that additional layer(s) may be added or deleted in the cell structure without departing from the scope of the present invention.

A metal contact layer (not shown) is deposited over the n+ semiconductor contact layer 539. The metal is the sequence of metal layers Ti/Au/Ag/Au.

Following the fabrication of the structure shown in FIG. 7A, the original substrate 501 is then removed by a sequence of lift-off, lapping and/or etching steps with a resulting configuration similar to that described and depicted in the solar cell of FIG. 3B. In the interest of brevity, such configuration will not be illustrated or described herein.

Figure 7B:
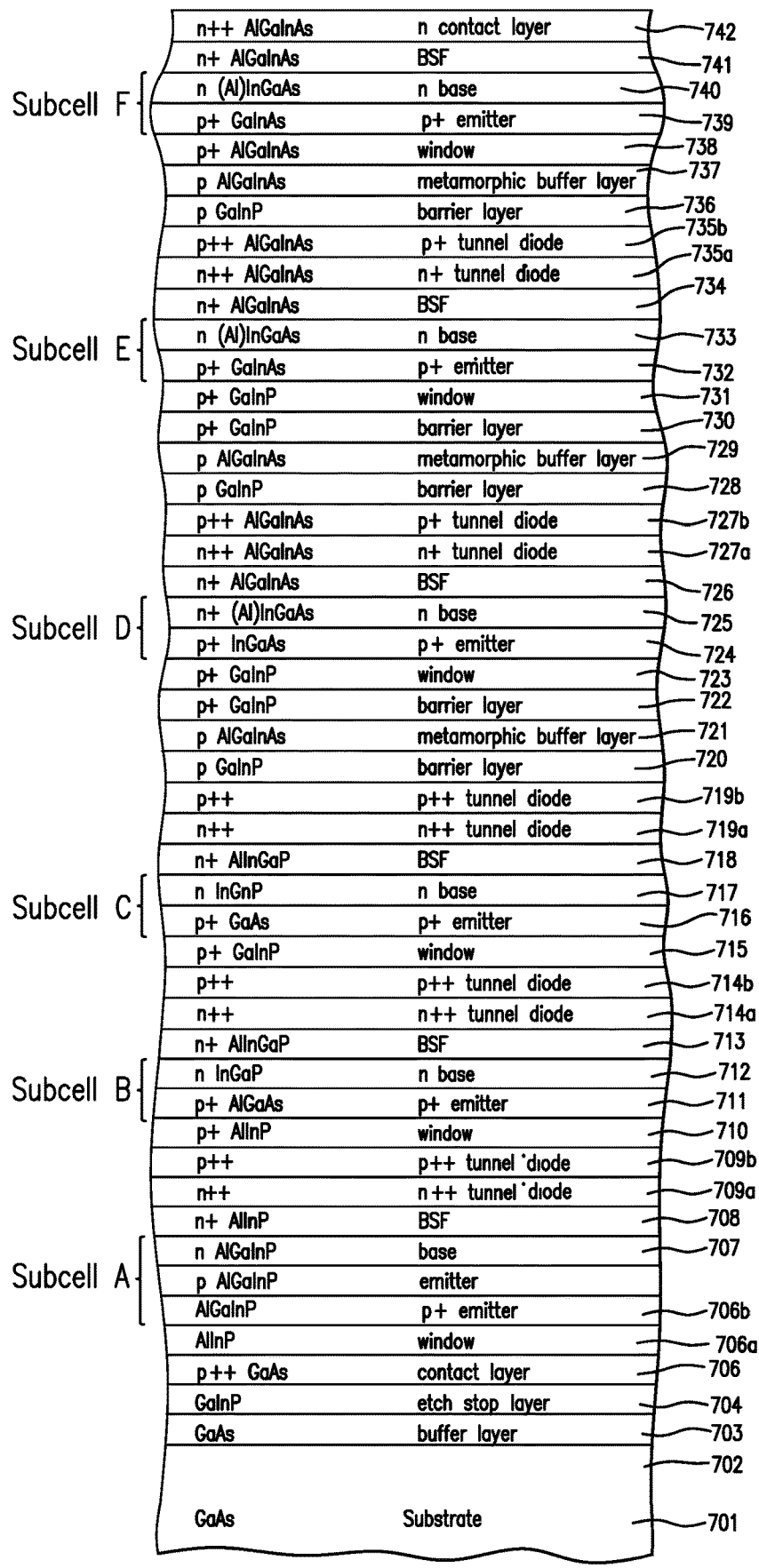
FIG. 7B is a cross-sectional view of the solar cell of a second embodiment of a six junction solar cell according to the present disclosure after an initial stage of fabrication including the deposition of certain semiconductor layers on the growth substrate.

FIG. 7B is a cross-sectional view of the solar cell of a second embodiment of a six junction solar cell after an initial stage of fabrication including the deposition of certain semiconductor layers on the growth substrate.

More specifically, FIG. 7B is a cross-sectional view of the solar cell in an embodiment of a six junction solar cell with three metamorphic layers. The layers 701 through 727b of this embodiment are substantially identical to those discussed in connection with layers 501 through 527b in the embodiment of FIG. 7A, and therefore in the interest of brevity of this disclosure, the description of such layers will not be repeated here.

Although the BSF layers 708, 713, 718, 726, 734 and 741 are illustrated in FIG. 7B to suggest that one or more such BSF layers may be included, as noted above, they are optional. Thus, in one embodiment, the band gap of the base layer 740 is greater than that of the emitter layer 739, and the BSF layer 741 is omitted. As previously noted, the omission of a BSF layer is one of the distinguishing structural features of the solar cell according to the present disclosure, and has important advantages in both lower cost (since neither the materials nor the production time to produce such layer is required) and improved electrical characteristics (e.g., lower series resistance).

In some embodiments a barrier or alpha layer 728, preferably composed of p-type GaInP, is deposited over the tunnel diode 727a/727b, to a thickness of between 0.25 and 1.0 micron. Such barrier layer is intended to prevent threading dislocations from propagating, either opposite to the direction of growth into the top and middle subcells A, B, C and D, or in the direction of growth into the subcell E, and is more particularly described in copending U.S. patent application Ser. No. 11/860,183, filed Sep. 24, 2007.

A metamorphic layer (or graded interlayer) 729 is deposited over the barrier layer 728. Layer 729 is preferably a compositionally step-graded series of AlGaInAs layers, preferably with monotonically changing lattice constant, so as to achieve a gradual transition in lattice constant in the semiconductor structure from subcell D to subcell E while minimizing threading dislocations from occurring. In some embodiments the band gap of layer 729 is constant throughout its thickness, preferably approximately equal to 1.1 eV, or otherwise consistent with a value slightly greater than the band gap of the third middle subcell D. One embodiment of the graded interlayer may also be expressed as being composed of $(In_xGa_{1-x})y Al_{1-y}As$, with $0<x<1$, $0<y<1$, and x and y selected such that the band gap of the interlayer remains constant at approximately 1.1 eV or other appropriate band gap. In some embodiments, a second barrier layer 730 may be deposited over layer 741.

A window layer 731 preferably composed of p+ type AlGaInAs is then deposited over layer 730. This window layer operates to reduce the recombination loss in the fifth subcell "E". It should be apparent to one skilled in the art that additional layers may be added or deleted in the cell structure without departing from the scope of the present invention.

On top of the window layer 731, the layers of cell E are deposited: the p+ emitter layer 732, and the n-type base layer 733. These layers are preferably composed of p+ type GaInAs and n type (Al)InGaAs respectively, although other suitable materials consistent with lattice constant and band gap requirements may be used as well.

The p++/n++ tunnel diode layers 735a and 735b respectively are deposited over the base layer 733 of subcell E, forming an ohmic circuit element to connect subcell E to subcell F. The layer 735a is composed of n++ AlGaInAs, and layer 735b is composed of p++ GaInP.

In some embodiments a barrier or alpha layer 736, preferably composed of p-type GaInP, is deposited over the tunnel diode 735a/735b, to a thickness of between 0.25 and 1.0 micron. Such barrier layer is intended to prevent threading dislocations from propagating, either opposite to the direction of growth into the top and middle subcells A, B, C, D and E, or in the direction of growth into the subcell F, and is more particularly described in copending U.S. patent application Ser. No. 11/860,183, filed Sep. 24, 2007.

A metamorphic layer (or graded interlayer) 737 is deposited over the barrier layer 736. Layer 737 is preferably a compositionally step-graded series of AlGaInAs layers, preferably with monotonically changing lattice constant, so as to achieve a gradual transition in lattice constant in the semiconductor structure from subcell E to subcell F while minimizing threading dislocations from occurring. In some embodiments the band gap of layer 737 is constant throughout its thickness, preferably approximately equal to 1.1 eV, or otherwise consistent with a value slightly greater than the band gap of the fourth middle subcell E. One embodiment of the graded interlayer may also be expressed as being composed of $(In_xGa_{1-x})y Al_{1-y}As$, with $0<x<1$, $0<y<1$, and x and y selected such that the band gap of the interlayer remains constant at approximately 1.1 eV or other appropriate band gap. In some embodiments, a second barrier layer (not shown) may be deposited over layer 737.

A window layer 738 preferably composed of p+ type AlGaInAs is then deposited over layer 737. This window layer operates to reduce the recombination loss in the sixth subcell "F". It should be apparent to one skilled in the art that additional layers may be added or deleted in the cell structure without departing from the scope of the present invention.

On top of the window layer 738, the layers of cell F are deposited: the p+ emitter layer 739, and the n-type base layer 740. These layers are preferably composed of p+ type GaInAs and n type GaInAs respectively, although other suitable materials consistent with lattice constant and band gap requirements may be used as well.

Finally a high band gap contact layer 742, preferably composed of n++ type AlGaInAs, is deposited on the base layer 740.

It should be apparent to one skilled in the art, that additional layer(s) may be added or deleted in the cell structure without departing from the scope of the present invention.

A metal contact layer (not shown) is deposited over the n+ semiconductor contact layer 742. The metal is the sequence of metal layers Ti/Au/Ag/Au.

Following the fabrication of the structure shown in FIG. 7B, the original substrate 701 is then removed by a sequence of lift-off, lapping and/or etching steps with a resulting configuration similar to that described and depicted in the solar cell of FIG. 3B. In the interest of brevity, such configuration will not be illustrated or described herein.

It will be understood that each of the elements described above, or two or more together, also may find a useful application in other types of structures or constructions differing from the types of structures or constructions described above.

Although described embodiments of the present disclosure utilizes a vertical stack of three, four, five or six subcells, various aspects and features of the present disclosure can apply to discrete, spaced-apart but electrically interconnected stacks with fewer or greater number of subcells, i.e. two junction cells, three junction cells, five, six, seven junction cells, etc., such as set forth in U.S. patent application Ser. No. 15/213,594 filed Jul. 19, 2016.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present disclosure for various applications. Such adaptations should and are intended to be comprehended within the meaning and range of equivalence of the following claims.

The invention claimed is:

1. A multijunction solar cell comprising:
a first electrically conductive contact layer having a first polarity and a second electrically conductive contact layer having a second opposite polarity, wherein the first electrically conductive contact layer is closer to a front-side of the solar cell operable to receive incident light, and the second conductive contact layer is closer to a back-side of the solar cell;
an upper first solar subcell having an emitter of p conductivity type with a first band gap, and a base of n+ conductivity type with a second band gap greater than the first band gap, the emitter and base of the upper first solar subcell forming a p-n junction;
a second solar subcell adjacent to the upper first solar subcell having an emitter of p conductivity type with a third band gap, and a base of n+ conductivity type, the emitter and base of the second solar subcell forming a p-n junction; and
a tunnel diode disposed between the upper first solar subcell and the second solar subcell, the tunnel diode being directly adjacent to the base of the upper first solar subcell,
wherein:
the emitter of the upper first solar subcell is doped in the range of $1\times10^{17}$ free carriers per cubic centimeter to $5\times10^{17}$ free carriers per cubic centimeter,
the upper first solar subcell and the second solar subcell are disposed between the first and second electrically conductive contact layers such that the p conductivity type emitter of the upper first solar subcell is closer to the first electrically conductive contact layer than are the n+ conductivity type base of the upper first solar subcell and the emitter and base of the second solar cell, and such that the n+ conductivity type base of the second solar subcell is closer to the second electrically conductive contact layer than are the p conductivity type emitter of the second solar subcell and the base and emitter of the upper first solar subcell.

2. A multijunction solar cell as defined in claim 1, wherein the base of the upper first solar subcell is doped in the range of $1\times10^{18}$ to $5\times10^{18}$ free carriers per cubic centimeter.

3. A multijunction solar cell as defined in claim 1, further comprising an intermediate grading interlayer disposed between the upper first solar subcell and the second solar subell and having a graded lattice constant that matches the upper first solar subcell on a first side and the second solar subcell on a second side, and having a band gap that is greater than the second band gap of the upper first solar subcell.

4. A multijunction solar cell as defined in claim 1, wherein the solar cell is a three junction solar cell, and the emitter of the upper first solar subcell is composed of GaInP or AlGaAs and the band gap of the emitter of the upper first solar subcell is equal to or greater than 1.91 eV, and the band gap of the base of the upper first solar subcell is in the range of 1.911 to 2.1 eV and greater than the band gap of the emitter.

5. A multijunction solar cell as defined in claim 4, wherein the emitter of the middle subcell is composed of (In)GaAs and the base of the middle solar subcell is composed of InGaP or AlGaAs, and the band gap of the emitter of the upper middle subcell is 1.41 eV, and the band gap of the base of the middle solar subcell is in the range of 1.411 to 1.91 eV and greater than the band gap of the emitter.

6. A multijunction solar cell as defined in claim 4, wherein the emitter of the bottom solar subcell is composed of InGaAs; the base of the bottom solar subcell is composed of InGaP or AlInGaAs and the band gap of the emitter of the bottom subcell is 1.0 eV, and the band gap of the base of the bottom solar subcell is in the range of 1.01 to 1.6 eV.

7. A multijunction solar cell as defined in claim 1, wherein the solar cell is a four junction solar cell wherein the base of the upper first solar subcell is composed of GaInP or AlGaAs and the emitter of the upper first solar subcell is composed of AlInGaP or AlGaAs and the band gap of the emitter of the upper first solar subcell is in the range of 1.91 to 2.0 eV, and the band gap of the base of the upper first solar subcell is greater than that of the emitter by an amount in the range of 0.01 eV to 1.0 eV.

8. A multijunction solar cell as defined in claim 1, wherein the solar cell is a five junction solar cell, and the base of the upper first solar subcell is composed of GaInP or AlGaAs; the emitter of the upper first solar subcell is composed of AlInGaP or AlGaAs; and the band gap of the emitter of the upper first solar subcell is 2.1 eV or greater, and the band gap of the base of the upper first solar subcell is greater than that of the emitter by an amount in the range of 0.01 to 0.1 eV.

9. A multijunction solar cell as defined in claim 1, wherein the solar cell is a six junction solar cell, and the base of the upper first solar subcell is composed of GaInP or AlGaAs and the emitter of the upper first solar subcell is composed of AlInGaP or AlGaAs and the band gap of the emitter of the upper first subcell is equal to or greater than 2.1 eV, and the band gap of the base of the upper first subcell is greater than that of the emitter by an amount in the range of 0.01 to 0.1 eV.

10. A multijunction solar cell as defined in claim 4, wherein the middle and bottom subcells have band gaps in the range of 1.2 to 1.8 eV, and 0.7 to 1.2 eV respectively.

11. A multijunction solar cell as defined in claim 7, wherein the middle and bottom subcells have band gaps in the range of 1.42 to 1.50 eV, and 1.05 to 1.15 eV, and 0.6 to 0.7 eV respectively.

12. A multijunction solar cell as defined in claim 8, wherein the middle and bottom subcells have band gaps in the range of 1.65 to 1.78 eV, 1.42 to 1.50 eV, 1.05 to 1.15 eV, and 0.6 to 0.9 eV respectively.

13. A multijunction solar cell as defined in claim 9, wherein the middle and bottom subcells have band gaps in the range of 1.65 to 1.78 eV, 1.42 to 1.50 eV, 1.05 to 1.15 eV, 0.7 to 0.85 eV, and 0.6 to 0.7 eV respectively.

14. A multijunction solar cell of claim 1, wherein the emitter of the upper first solar subcell has a gradation in doping from a top of the emitter adjacent to a window layer to the bottom of the emitter directly disposed over the base region, wherein the doping at the top of the emitter is approximately $1 \times 10^{18}$ free carriers per cubic centimeter and wherein the doping at the bottom of the emitter is in the range of $5 \times 10^{15}$ free carriers per cubic centimeter to $1 \times 10^{16}$ free carriers per cubic centimeter.

15. A multijunction solar cell of claim 1, wherein the emitter of the upper first solar subcell has a thickness at least three times thicker than the base of the upper first solar subcell.

16. A multijunction solar cell of claim 1, wherein the emitter layer of the second solar subcell is directly adjacent to the tunnel diode layer.

17. A multijunction solar cell as defined in claim 1, wherein the emitter of the upper first solar subcell has a first region in which the doping is graded, and a second region directly disposed over the first region in which the doping is constant.

18. A multijunction solar cell as defined in claim 7, further comprising a first graded interlayer composed of any of the As, N, Sb based III-V compound semiconductors disposed between the second and third subcell and subject to the constraints of having the in-plane lattice parameter greater or equal to that of the second subcell and less than or equal to that of the third subcell, and having a band gap energy greater than that of the third subcell, and is compositionally graded to lattice match the second subcell on one side and the third subcell on the other side, and a second graded interlayer is composed of any of the As, N, Sb based III-V compound semiconductors disposed between the third and bottom subcell and subject to the constraints of having the in-plane lattice parameter greater or equal to that of the third subcell and less than or equal to that of the bottom fourth subcell, and having a band gap energy greater than that of the third subcell, and is compositionally graded to lattice match the third subcell on one side and the bottom fourth subcell on the other side.

19. A multijunction solar cell as defined in claim 18, wherein the first and second graded interlayers are composed of $(In_xGa_{1-x})_yAl_{1-y}As$ with $0<x<1$, $0<y<1$, and x and y selected such that the band gap of each interlayer remains constant throughout its thickness.

20. A multijunction solar cell as defined in claim 18, wherein the band gap of the first graded interlayer remains constant at 1.5 eV throughout the thickness of the first graded interlayer, and the band gap of the second graded interlayer remains constant at 1.1 eV throughout the thickness of the second graded interlayer.

21. A multijunction solar cell as defined in claim 1, wherein there is no back surface field (BSF) layer between the tunnel diode and the base layer of the upper first solar subcell.

22. A multijunction solar cell as defined in claim 1, wherein there is no back surface field (BSF) layer between the upper first solar subcell and the second solar subcell.

\* \* \* \* \*